US011171184B2

United States Patent
Lee et al.

(10) Patent No.: US 11,171,184 B2
(45) Date of Patent: Nov. 9, 2021

(54) DISPLAY DEVICE AND METHOD OF MANUFACTURING THE SAME

(71) Applicant: Samsung Display Co., Ltd., Yongin-si (KR)

(72) Inventors: Tae Hee Lee, Hwaseong-si (KR); Sung Kook Park, Suwon-si (KR); So Hee Park, Cheonan-si (KR); Hee Seomoon, Hwaseong-si (KR); Won Ki Hong, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/429,078

(22) Filed: Jun. 3, 2019

(65) Prior Publication Data

US 2020/0058712 A1   Feb. 20, 2020

(30) Foreign Application Priority Data

Aug. 20, 2018   (KR) .......................... 10-2018-0097012

(51) Int. Cl.
| | |
|---|---|
| G06F 3/041 | (2006.01) |
| G06F 3/044 | (2006.01) |
| H01L 27/32 | (2006.01) |
| H05K 1/14 | (2006.01) |
| H05K 1/18 | (2006.01) |

(52) U.S. Cl.
CPC ............ *H01L 27/323* (2013.01); *G06F 3/044* (2013.01); *G06F 3/0412* (2013.01); *H05K 1/147* (2013.01); *H05K 1/189* (2013.01); *G06F 2203/04103* (2013.01); *G06F 2203/04105* (2013.01); *H01L 27/3244* (2013.01); *H05K 2201/056* (2013.01); *H05K 2201/10128* (2013.01); *H05K 2201/10151* (2013.01)

(58) Field of Classification Search
CPC ... H01L 27/323; H01L 27/3244; H05K 1/147; H05K 1/189; H05K 2201/10128; H05K 2201/10151; H05K 2201/056; G06F 3/044; G06F 3/0412; G06F 2203/04103; G06F 2203/04105; G06F 3/0414; G06F 1/20; G06F 2203/04102
See application file for complete search history.

(56) References Cited

U.S. PATENT DOCUMENTS

| | | | |
|---|---|---|---|
| 7,538,760 B2 | 5/2009 | Hotelling et al. | |
| 8,654,524 B2 | 2/2014 | Pance et al. | |
| 8,686,952 B2 | 4/2014 | Burrough et al. | |
| 8,787,006 B2 | 7/2014 | Golko et al. | |
| 10,282,010 B2 * | 5/2019 | Choi ..................... | G06F 3/0446 |
| 2010/0259503 A1 * | 10/2010 | Yanase ................ | G06F 3/04166 |
| | | | 345/174 |
| 2013/0155627 A1 | 6/2013 | Mareno et al. | |
| 2014/0028575 A1 | 1/2014 | Parivar et al. | |
| 2014/0085213 A1 | 3/2014 | Huppi et al. | |
| 2014/0091857 A1 | 4/2014 | Bernstein | |

(Continued)

*Primary Examiner* — Benyam Ketema
(74) *Attorney, Agent, or Firm* — H.C. Park & Associates, PLC

(57) ABSTRACT

A display device includes: a display panel; a first force sensor disposed below the display panel; a display circuit board attached to a first side of the display panel; and a first flexible circuit board connecting the first force sensor and the display circuit board, wherein the display circuit board and the first flexible circuit board are bent at least once.

23 Claims, 27 Drawing Sheets

(56) References Cited

U.S. PATENT DOCUMENTS

| | | | |
|---|---|---|---|
| 2014/0092064 A1 | 4/2014 | Bernstein et al. | |
| 2014/0126227 A1* | 5/2014 | Yoon | G09F 9/301 362/382 |
| 2014/0293145 A1 | 10/2014 | Jones et al. | |
| 2014/0307396 A1* | 10/2014 | Lee | H05K 1/028 361/749 |
| 2015/0324056 A1* | 11/2015 | Sato | G06F 1/169 345/174 |
| 2015/0331451 A1* | 11/2015 | Shin | G06F 1/1626 345/173 |
| 2016/0062517 A1 | 3/2016 | Meyer et al. | |
| 2016/0268523 A1* | 9/2016 | Kim | H01L 51/529 |
| 2017/0255314 A1* | 9/2017 | Choi | G06F 3/165 |
| 2018/0063942 A1* | 3/2018 | Kim | H01L 51/0097 |
| 2018/0088736 A1* | 3/2018 | Jeong | G06F 3/04144 |
| 2018/0212169 A1* | 7/2018 | Goto | H01L 51/5253 |
| 2019/0072997 A1* | 3/2019 | Cha | G06F 1/1656 |

\* cited by examiner

FIG. 7
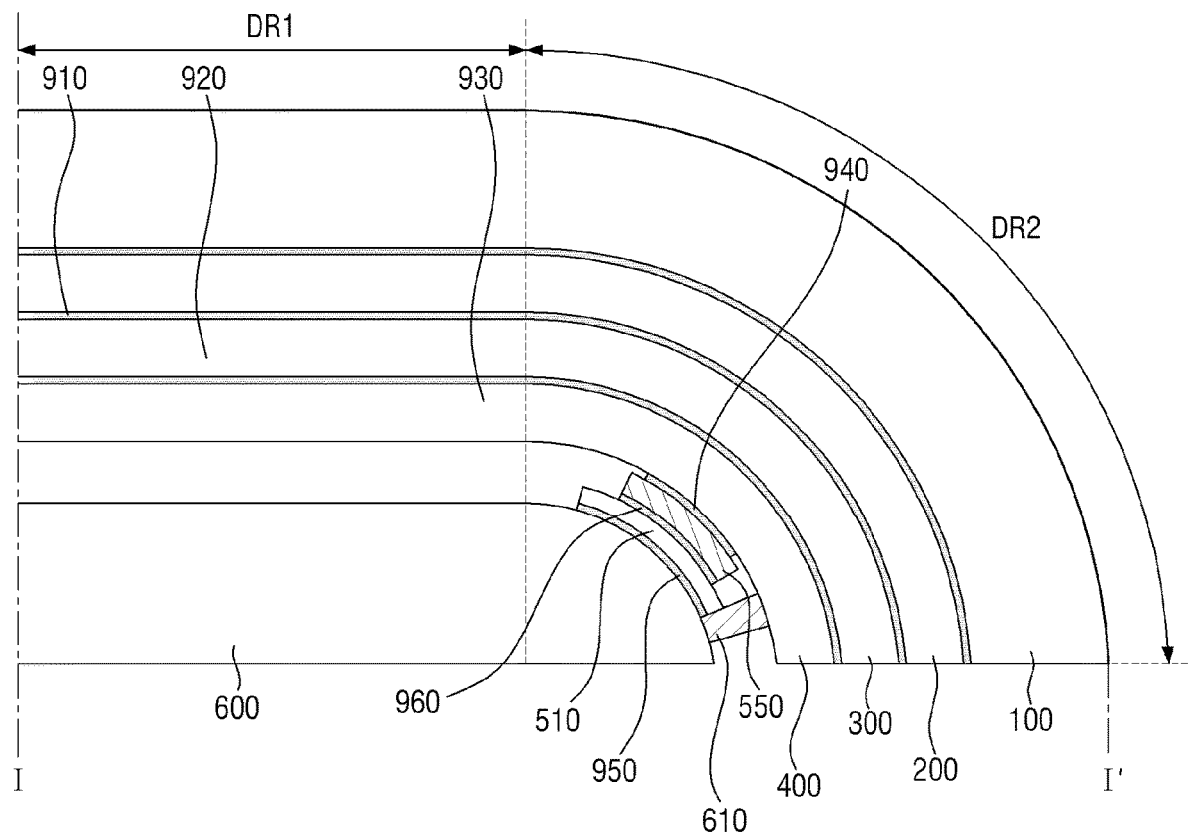
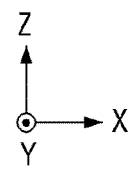

FIG. 10
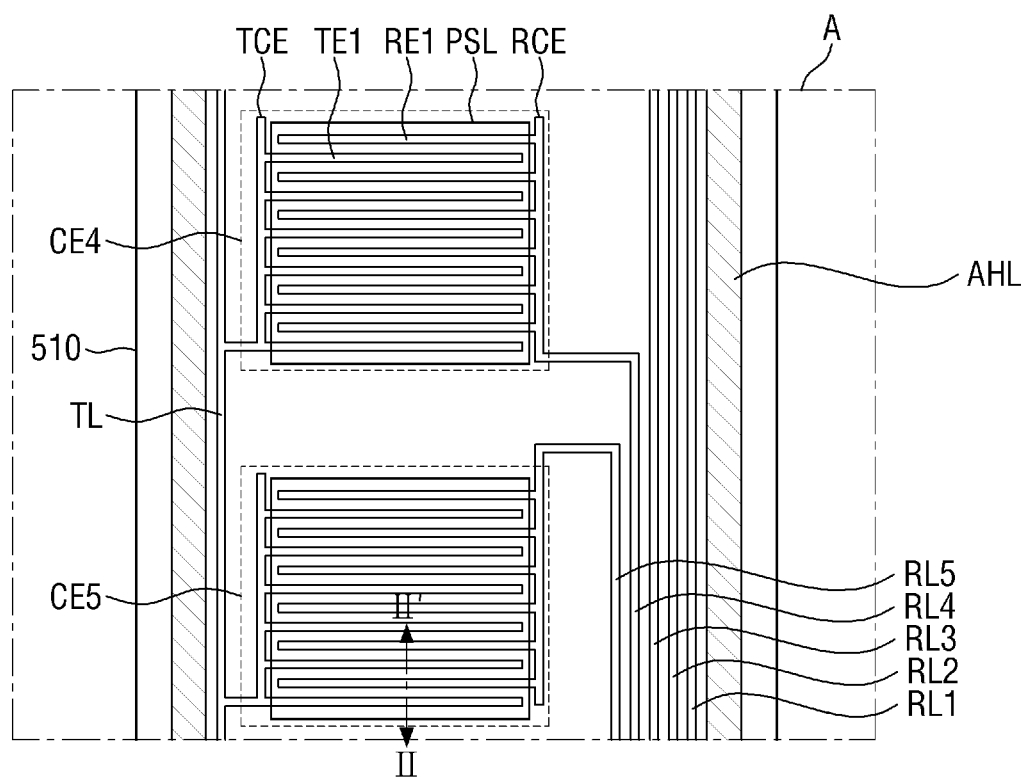
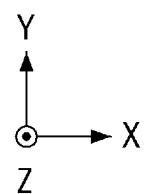

FIG. 11
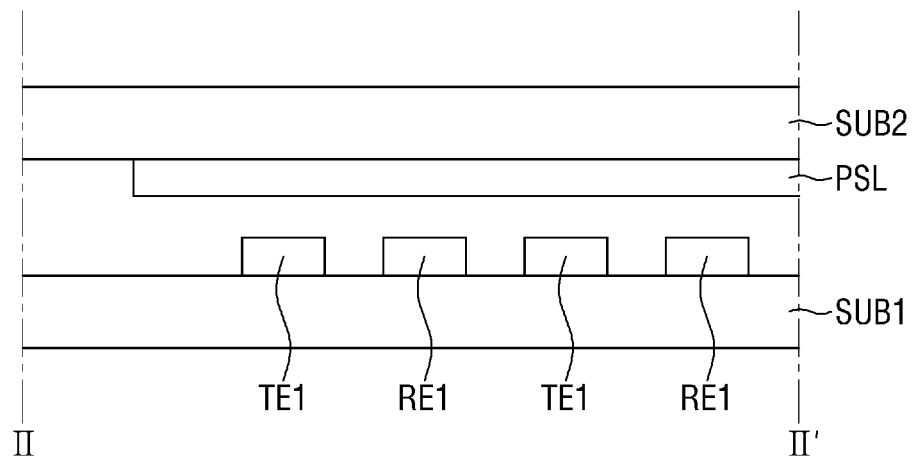
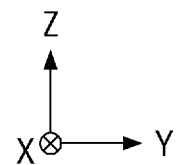

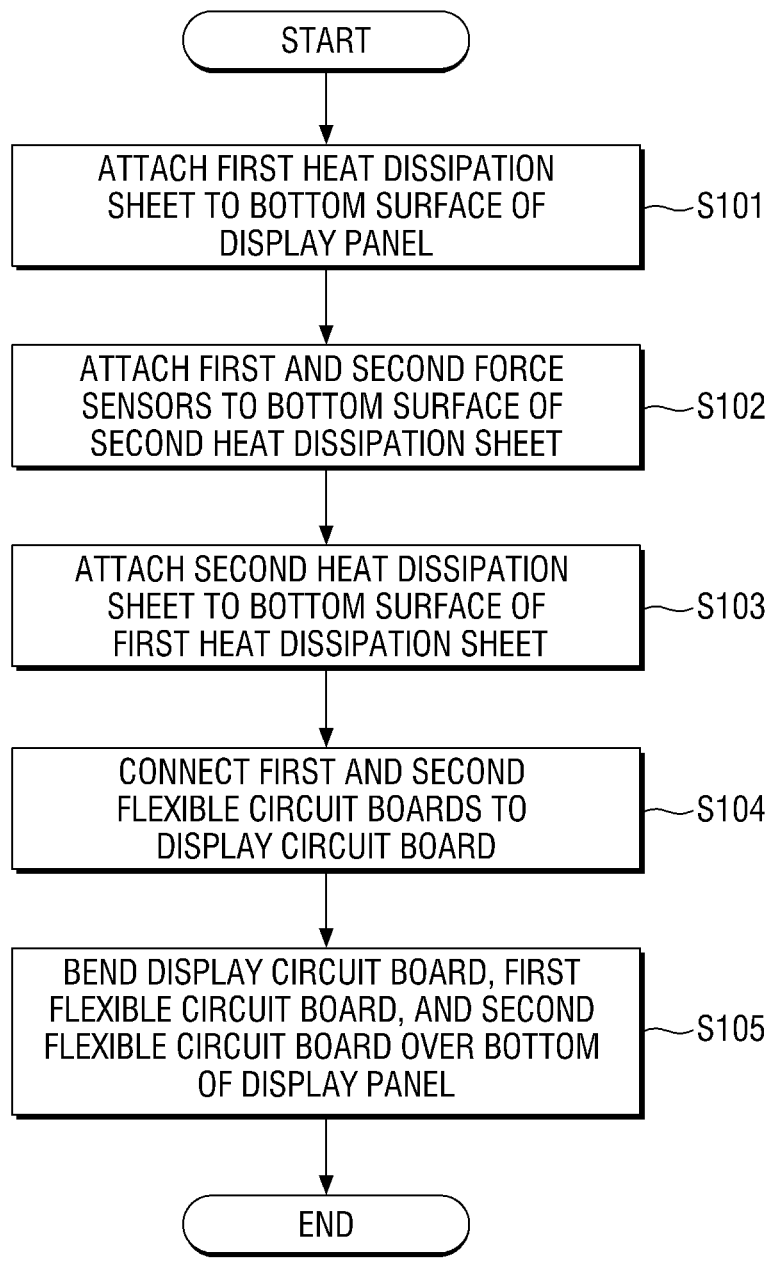

DISPLAY DEVICE AND METHOD OF MANUFACTURING THE SAME

This application claims priority to and the benefit of Korean Patent Application No. 10-2018-0097012, filed on Aug. 20, 2018, which is hereby incorporated by reference for all purposes as if fully set forth herein.

BACKGROUND

Field

Exemplary implementations of the invention related generally to a display device and a method of manufacturing the same.

Discussion of the Background

Electronic devices may provide an image to a user. Such devices include smartphones, tablet personal computers (PCs), digital cameras, notebook computers, navigation devices, and smart televisions (TVs). The display device includes a display panel, which is generates and displays an image, and various input devices.

Recently, touch panels capable of recognizing touch input have been widely used in electronic devices, mainly in smartphones or tablet PCs. Due to the convenience of use, touch panels are increasingly replacing existing physical input devices such as keypads. Research has been conducted on ways to implement a force sensor as an input device by mounting the force sensor in a display device.

The above information disclosed in this Background section is only for understanding of the background of the inventive concepts, and, therefore, it may contain information that does not constitute prior art.

SUMMARY

Devices constructed according to exemplary implementations of the invention provide a display device in which a force sensor can be implemented as an input device. Also, methods according to exemplary implementations of the invention, a method of manufacturing a display device is provided in which a force sensor can be implemented as an input device.

Additional features of the inventive concepts will be set forth in the description which follows, and in part will be apparent from the description, or may be learned by practice of the inventive concepts.

According to one or more embodiments of the invention, a display device includes: a display panel; a first force sensor disposed below the display panel; a display circuit board attached to a first side of the display panel; and a first flexible circuit board connecting the first force sensor and the display circuit board, wherein the display circuit board and the first flexible circuit board are bent at least once.

The display device may further include: a panel bottom member disposed below the display panel.

The first force sensor may be attached to a bottom surface of the panel bottom member, and the first flexible circuit board may be bent below the panel bottom member, the first flexible circuit board including: a first end of the first flexible circuit board attached to a first pad unit of the first force sensor; and a second end of the first flexible circuit board disposed below the panel bottom member.

The first pad unit of the first force sensor may be disposed at one end of the first force sensor in a longitudinal direction of the first force sensor.

The first flexible circuit board may extend from the first pad unit of the first force sensor in a first direction, and the first flexible circuit board may be bent in a second direction crossing the first direction.

The display circuit board may be bent over a bottom side of the panel bottom member, the display circuit board including: a first side of the display circuit board attached to one surface of the display panel; and a second side of the display circuit board disposed below the panel bottom member.

The display device may further include: a second force sensor disposed below the display panel; and a second flexible circuit board connecting the second force sensor and the display circuit board, the second flexible circuit board may be bent at least once.

The display device may further include: a panel bottom member disposed below the display panel.

The second force sensor may be attached to a bottom surface of the panel bottom member, and the second flexible circuit board may be bent below the panel bottom member, the second flexible circuit board including: a first end of the second flexible circuit board attached to a second pad unit of the second force sensor; and a second end of the second flexible circuit board disposed below the panel bottom member.

The second pad unit of the second force sensor may be disposed at one end of the second force sensor in a longitudinal direction of the second force sensor.

The second flexible circuit board may extend from the second pad unit of the second force sensor in a first direction, and the second flexible circuit board may be bent in a second direction crossing the first direction.

The display circuit board includes: a first connector connected to a first connector connecting portion of the first flexible circuit board, the first connector connecting portion disposed at the second end of the first flexible circuit board; and a second connector connected to a second connector connecting portion of the second flexible circuit board, the second connector connecting portion disposed at the second end of the second flexible circuit board.

The first connector may be disposed adjacent to the first side of the display circuit board, and the second connector may be disposed adjacent to a second side of the display circuit board that is opposite to the first side of the display circuit board.

The display circuit board may include: a first connector receiving portion connected to a first connector connecting portion of the first flexible circuit board, the first connector connecting portion disposed at the first end of the first flexible circuit board; and a second connector receiving portion connected to a second connector connecting portion of the second flexible circuit board, the second connector connecting portion disposed at the first end of the second flexible circuit board.

In a plan view, the first side of the display panel may be partially recessed, the display panel including a first protruding portion and a second protruding portion in which pixels are formed to display an image.

The display circuit board may be disposed on the first and second protruding portions.

The display panel may include: a first area having a flat planar surface, a second area extending from a first side of the first area, the second area being curved; and a third area extending from a second side of the first area opposite to the first side of the first area, the third area being curved, and the first and second force sensors may be disposed in the second and third areas, respectively.

The first force sensor may include force sensor cells, each of the force sensor cells including: driving electrodes and sensing electrodes disposed on a surface of a first substrate; and a force sensing layer disposed on a surface of a second substrate facing the first substrate.

The display device may further include: a waterproof member disposed adjacent to the first and second force sensors.

According to one or more embodiments of the invention, a method of manufacturing a display device includes: attaching a first force sensor to one edge on a bottom surface of a heat dissipation sheet; attaching the heat dissipation sheet to a bottom surface of a display panel through lamination using a roller; attaching a first flexible circuit board to a pad unit of the first force sensor; attaching a display circuit board to one side of the display panel; connecting the first flexible circuit board to a first connector of the display circuit board; and fixing the display circuit board and the first flexible circuit board by bending the display circuit board and the first flexible circuit board over the bottom side of the display panel.

The display panel may include: a first area having a flat planar surface and a second area extending from one side of the first area, the second area being curved, and the first force sensor may be disposed in the second area.

The attaching of the heat dissipation sheet may include: placing the roller on the bottom surface of the heat dissipation sheet in the first area of the display panel and pressurizing the heat dissipation sheet with the roller.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 7 is a cross-sectional view taken along a sectional line I-I' of FIGS. 3 and 4.

FIG. 10 is a plan view illustrating an area A of FIG. 9.

FIG. 11 is a cross-sectional view taken along a sectional line II-II' of FIG. 10.

FIG. 22 is a flowchart illustrating a method of manufacturing a display device constructed according to an exemplary embodiment.

DETAILED DESCRIPTION

Figure 1:
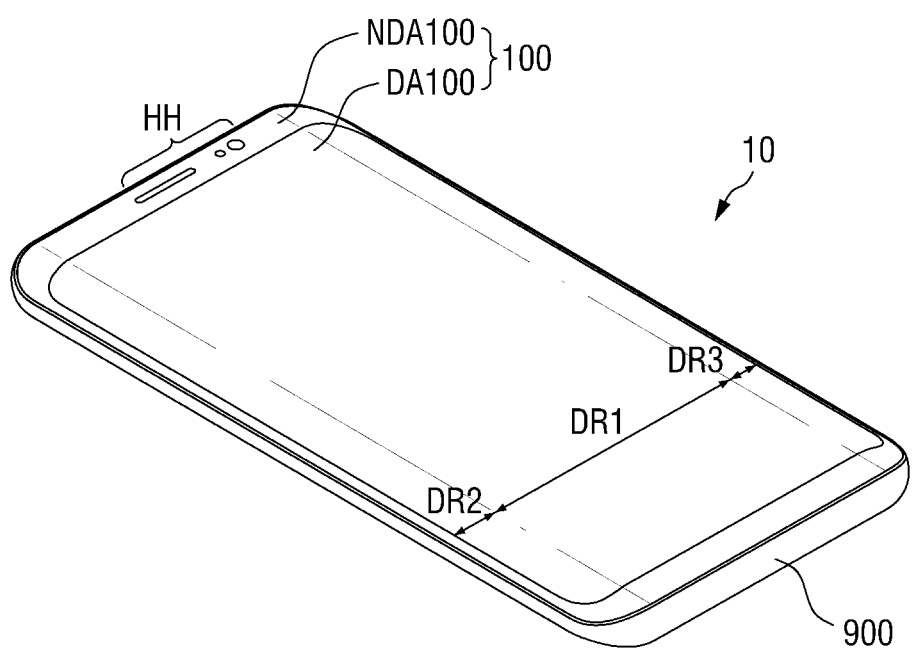
FIG. 1 is a perspective view of a display device constructed according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, a X-axis, a Y-axis, and a Z-axis are not limited to axes of a rectangular coordinate system, such as the x, y, and z-axes, and may be interpreted in a broader sense. For example, the a X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
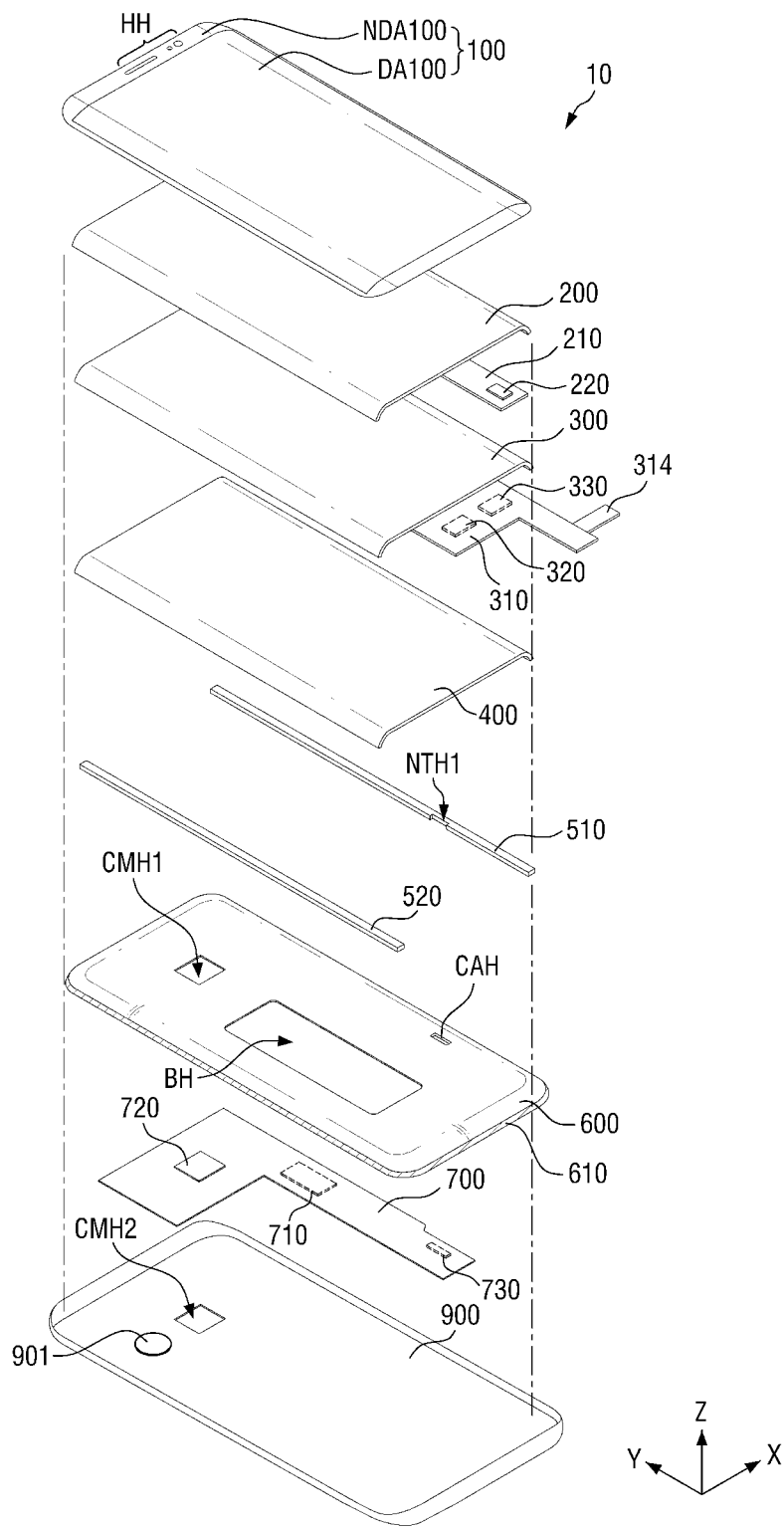
FIG. 2 is an exploded perspective view of the display device of FIG. 1.

FIG. 1 is a perspective view of a display device constructed according to an exemplary embodiment of the present disclosure. FIG. 2 is an exploded perspective view of the display device of FIG. 1.

Referring to FIGS. 1 and 2, a display device 10 includes a cover window 100, a touch sensing device 200, a touch circuit board 210, a touch driving unit 220, a display panel 300, a display circuit board 310, a display driving unit 320, a force sensing unit 330, a first force sensor 510, a second force sensor 520, a frame 600, a main circuit board 700, and a lower cover 900.

The terms "above", "top", and "top surface", as used herein, denote a direction in which the cover window 100 is disposed with respect to the display panel 300, i.e., a Z-axis direction, and the terms "below", "bottom", and "bottom surface", as used herein, denote a direction in which the frame 600 is disposed with respect to the display panel 300, i.e., the direction opposite to the Z-axis direction. Also, the terms "left", "right", "upper", and "lower", as used herein, denote corresponding directions as viewed from above the display panel 300. For example, the term "left" denotes the direction opposite to an X-axis direction, the term "right" denotes the X-axis direction, the term "upper" denotes a Y-axis direction, and the term "lower" denotes the direction opposite to the Y-axis direction.

The display device 10 may have a rectangular shape in a plan view. For example, in a plan view, the display device 10 may have a rectangular shape having short sides extending in a first direction (or the X-axis direction) and long sides extending in a second direction (or a Y-axis direction). The corners where the short sides and the long sides meet may be rounded or right-angled. The planar shape of the display device 10 is not particularly limited, and the display device 10 may be formed in various other shapes such as a polygonal shape other than a rectangular shape, a circular shape, or an elliptical shape.

The display device 10 may include a first area DR1, which is flat, a second area DR2, which extends from the left side of the first area DR1, and a third area DR3, which extends from the right side of the first area DR1. The second and third areas DR2 and DR3 may be flat or curved. In a case where the second and third areas DR2 and DR3 are flat, the first area DR1 and the second and third areas DR2 and DR3 may form an obtuse angle with each other. In a case where the second and third areas DR2 and DR3 are curved, the second and third areas DR2 and DR3 may have a predetermined curvature or a variable curvature. In this case, the first area DR1, the second area DR2, and the third area DR3 may be referred to as a flat portion, a first curved portion, and a second curved portion, respectively.

FIG. 1 illustrates the second and third areas DR2 and DR3 as extending from the left and right sides, respectively, of the first area DR1, but the present disclosure is not limited thereto. That is, one of the second and third areas DR2 and DR3 may not be provided. In addition to the second and third areas DR2 and DR3, a fourth area may be further provided to extend from at least one of the upper and lower sides of the first area DR1.

The cover window 100 may be disposed on the display panel 300 to cover the top surface of the display panel 300. Accordingly, the cover window 100 may protect the top surface of the display panel 300. Referring to FIG. 7, the cover window 100 may be attached to the touch sensing device 200 via a first adhesive member 910. The first adhesive member 910 may be an optically clear adhesive (OCA) or an optically clear resin (OCR).

The cover window 100 may include a light-transmitting portion DA100, which corresponds to the display panel 300, and a light-blocking portion NDA100, which corresponds to the rest of the display device 10. The cover window 100 may be disposed in the first, second, and third areas DR1, DR2, and DR3. The light-transmitting portion DA100 may be disposed in parts of the first, second, and third areas DR1, DR2, and DR3. The light-blocking portion NDA100 may be formed to be opaque. In a case where the light-blocking portion NDA100 does not display an image, the light-blocking portion NDA100 may be formed as a decorative layer that can be seen by a user. For example, a company's logo such as SAMSUNG® or a string of various characters or letters may be patterned into the light-blocking portion NDA100. Also, holes HH, which are for exposing a front camera, a front speaker, an infrared (IR) sensor, an iris recognition sensor, an ultrasonic sensor, and an illumination sensor, may be formed in the light-blocking portion NDA100, but the present disclosure is not limited thereto. For example, some or all of the front camera, the front speaker, the IR sensor, the iris recognition sensor, and the illumination sensor may be embedded in the display panel 300, in which case, some or all of the holes HH may not be provided.

The cover window 100 may be formed of glass, sapphire, and/or plastic. The cover window 100 may be formed to be rigid or flexible.

The touch sensing device 200 may be disposed between the cover window 100 and the display panel 300. The touch sensing device 200 may be disposed in the first, second, and third areas DR1, DR2, and DR3. Accordingly, touch input from the user can be detected not only in the first area DR1, but also in the second and third areas DR2 and DR3.

As illustrated in FIG. 7, the touch sensing device 200 may be attached to the bottom surface of the cover window 100 via the first adhesive member 910. A polarizing film may be added to the top of the touch sensing device 200 to prevent or reduce the degradation of visibility that may be caused by the reflection of external light. In this case, the polarizing film may be attached to the bottom surface of the cover window 100 via the first adhesive member 910.

The touch sensing device 200, which is a device for detecting the location of touch input from the user, may be implemented as being of a capacitive type such as a self-capacitance type or a mutual capacitance type. In a case where the touch sensing device 200 is implemented as being of the self-capacitance type, the touch sensing device 200 may include only touch driving electrodes. On the other hand, in a case where the touch sensing device 200 is implemented as being of the mutual capacitance type, the touch sensing device 200 may include touch driving electrodes and touch sensing electrodes. In the description that follows, it is assumed that the touch sensing device 200 is of the mutual capacitance type.

The touch sensing device 200 may be formed as a panel or a film. In this case, the touch sensing device 200 may be attached to a thin-film encapsulation film of the display panel 300 via a second adhesive member 920, as illustrated in FIG. 7. The second adhesive member 920 may be an OCA or an OCR.

The touch sensing device 200 may be formed in one integral body with the display panel 300. In this case, the touch driving electrodes and the touch sensing electrodes of the touch sensing device 200 may be formed on the thin-film encapsulation film of the display panel 300.

Figure 4:
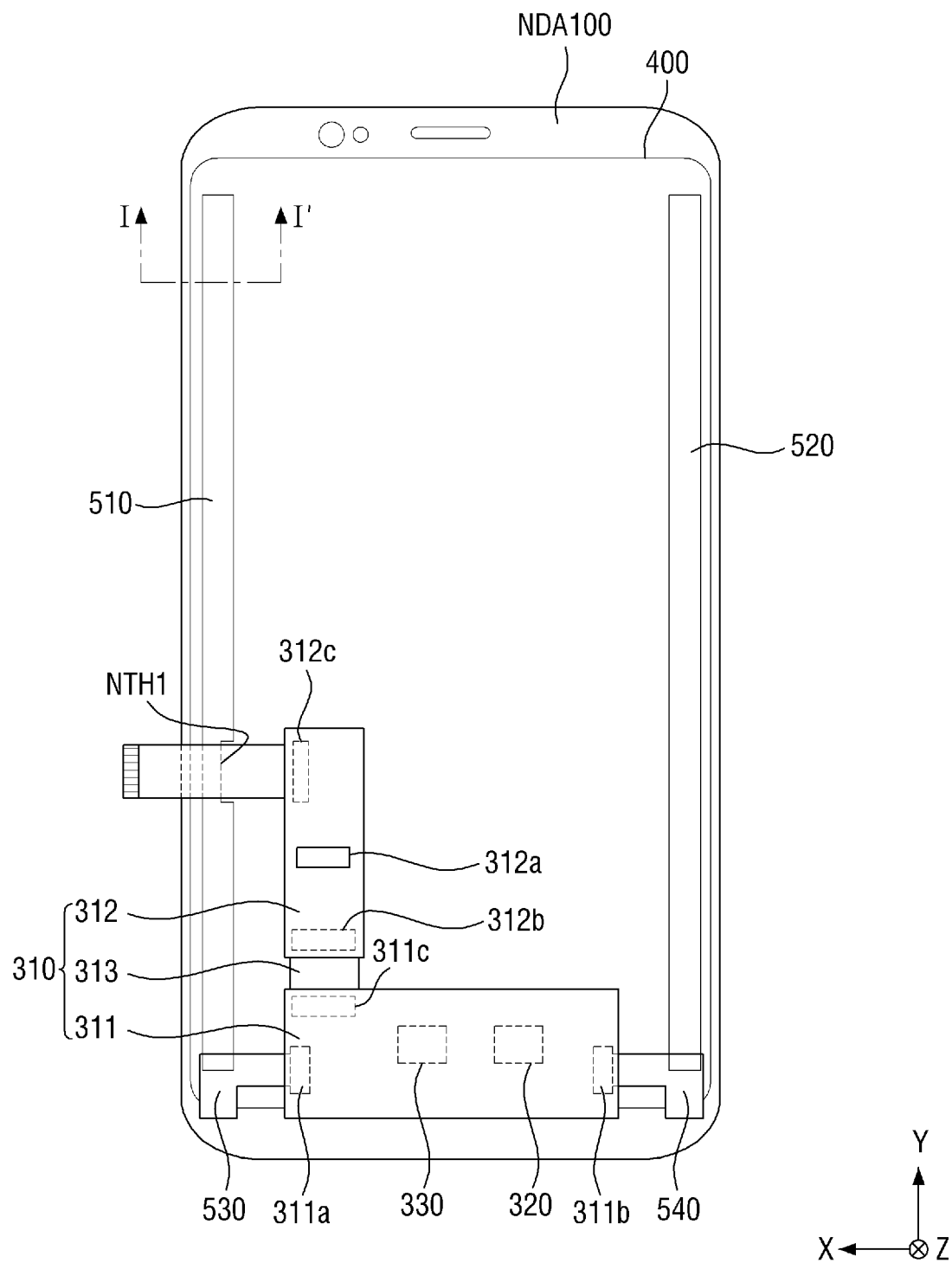
FIG. 4 is a bottom view of the display panel attached to the cover window when the display circuit board, after bending the first flexible circuit board, and the second flexible circuit board of FIG. 2 downwardly.

The touch circuit board 210 may be attached to one side of the touch sensing device 200. Specifically, one side of the touch circuit board 210 may be attached to pads provided on one side of the touch sensing device 200 via an anisotropic conductive film. As illustrated in FIG. 4, a touch connecting portion may be provided at the other side of the touch circuit board 210 and may be connected to a touch connector 312a of the display circuit board 310. The touch circuit board 210 may be a flexible printed circuit board (FPCB).

The touch driving unit 220 may apply touch driving signals to the touch driving electrodes of the touch sensing device 200, may detect sensing signals from the touch sensing electrodes of the touch sensing device 200, and may calculate the location of touch input from the user by analyzing the detected sensing signals. The touch driving unit 220 may be formed as an integrated circuit and may be mounted on the touch circuit board 210.

The display panel 300 may be disposed below the touch sensing device 200. The display panel 300 may be disposed to overlap with the light-transmitting portion 100DA of the cover window 100. The display panel 300 may be disposed in the first, second, and third areas DR1, DR2, and DR3. As a result, an image from the display panel 300 can be seen not only in the first area DR1, but also in the second and third areas DR2 and DR3.

The display panel 300 may be a light-emitting display panel including light-emitting elements. For example, the display panel 300 may be an organic light-emitting diode (OLED) display panel using OLEDs, a micro light-emitting diode (mLED) display panel using mLEDs, or a quantum-dot light-emitting diode (QLED) display panel using QLEDs. In the description that follows, it is assumed that the display panel 300 is an OLED display panel as illustrated in FIG. 8.

Figure 8:
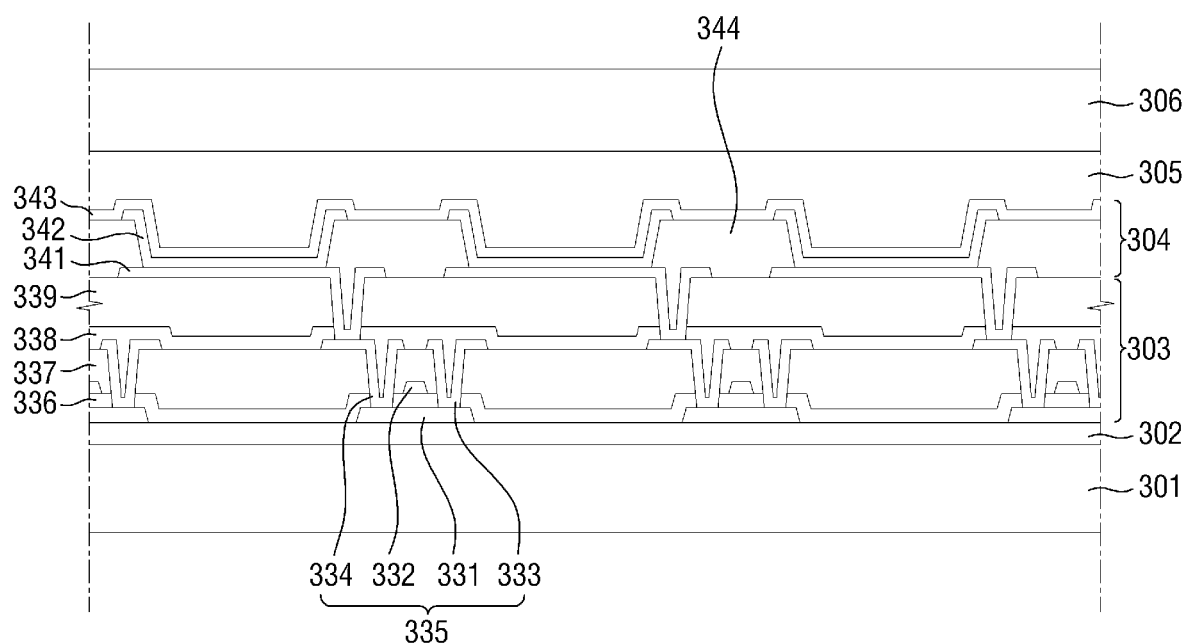
FIG. 8 is a cross-sectional view illustrating a display area of the display panel.

Referring to FIG. 8, a display area DA of the display panel 300 is an area in which a light-emitting element layer 304 is formed and an image is displayed, and a non-display area NDA of the display panel 300 is an area which is on the periphery of the display area DA.

The display panel 300 may include a supporting substrate 301, a flexible substrate 302, a thin-film transistor (TFT) layer 303, the light-emitting element layer 304, a thin-film encapsulation layer 305, and a barrier film 306.

The flexible substrate 302 is disposed on the supporting substrate 301. The supporting substrate 301 and the flexible substrate 302 may include a polymer material having flexibility. For example, the supporting substrate 301 and the flexible substrate 302 may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof.

The TFT layer 303 is formed on the flexible substrate 302. The TFT layer 303 includes TFTs 335, a gate insulating film 336, an interlayer insulating film 337, a passivation film 338, and a planarization film 339.

A buffer film may be formed on the flexible substrate 302. The buffer film may be formed on the flexible substrate 302 to protect the TFTs 335 and the light-emitting elements against moisture that may penetrate the supporting substrate 301 and the flexible substrate 302, which are susceptible to moisture. The buffer film may consist of a plurality of inorganic films that are alternately stacked. For example, the buffer film may be formed as a multilayer film in which at least one of a silicon oxide (SiOx) film and a silicon nitride (SiNx) film is alternately stacked. The buffer layer may not be provided.

The TFTs 335 are formed on the buffer film. Each of the TFTs 335 includes an active layer 331, a gate electrode 332, a source electrode 333, and a drain electrode 334. FIG. 8 illustrates the TFTs 335 as having a top gate structure in which the gate electrode 332 is disposed above the active layer 331, but the present disclosure is not limited thereto.

That is, the TFTs 335 may have a bottom gate structure in which the gate electrode 332 is disposed below the active layer 331 or a double gate structure in which the gate electrode 332 is disposed both above and below the active layer 331.

The active layer 331 is formed on the buffer film. The active layer 331 may be formed of a silicon-based semiconductor material or an oxide-based semiconductor material. A light-shielding layer for blocking external light incident on the active layer 331 may be formed between the buffer layer and the active layer 331.

A gate insulating film 336 may be formed on the active layer 331. The gate insulating film 336 may be formed as an inorganic film such as, for example, a silicon oxide film, a silicon nitride film, or a multilayer film thereof.

The gate electrode 332 and a gate line may be formed on the gate insulating film 336. The gate electrode 332 and the gate line may be formed as single- or multilayer films using molybdenum (Mo), aluminum (Al), chromium (Cr), gold (Au), titanium (Ti), nickel (Ni), neodymium (Ne), copper (Cu), or an alloy thereof.

The interlayer insulating film 337 may be formed on the gate electrode 332 and the gate line. The interlayer insulating film 337 may be formed as an inorganic film such as, for example, a silicon oxide film, a silicon nitride film, or a multilayer film thereof.

The source electrode 333, the drain electrode 334, and a data line may be formed on the interlayer insulating film 337. The source electrode 333 and the drain electrode 334 may be connected to the active layer 331 through contact holes penetrating the gate insulating film 336 and the interlayer insulating film 337. The source electrode 333, the drain electrode 334, and the data line may be formed as single or multilayer films using Mo, Al, Cr, Au, Ti, Ni, Ne, Cu, or an alloy thereof.

The passivation film 338 may be formed on the source electrode 333, the drain electrode 334, and the data line to insulate the TFTs 335. The passivation film 338 may be formed as an inorganic film such as, for example, a silicon oxide film, a silicon nitride film, or a multilayer film thereof.

The planarization film 339 may be formed on the passivation film 338 to planarize height differences formed by the TFTs 335. The planarization film 339 may be formed as an organic film using an acrylic resin, an epoxy resin, a phenolic resin, a polyamide resin, or a polyimide resin.

The light-emitting element layer 304 is formed on the TFT layer 303. The light-emitting element layer 304 includes the light-emitting elements and a pixel-defining film 344.

The light-emitting elements and the pixel-defining film 344 are formed on the planarization film 339. The light-emitting elements may be OLEDs. In this case, each of the light-emitting elements may include an anode electrode 341, a light-emitting layer 342, and a cathode electrode 343.

The anode electrode 341 may be formed on the planarization film 339. The anode electrode 341 may be connected to the source electrode 333 through a contact hole penetrating the passivation film 338 and the planarization film 339.

The pixel-defining film 344 may be formed to cover the edges of the anode electrode 341 to define a corresponding pixel. That is, the pixel-defining film 344 may define each pixel. Each pixel may be a region in which the anode electrode 341, the light-emitting layer 342, and the cathode electrode 343 are sequentially stacked and holes from the anode electrode 341 and electrons from the cathode electrode 343 are combined in the light-emitting layer 342 to emit light.

The light-emitting layer 342 may be formed on the anode electrode 341 and the pixel-defining film 344. The light-emitting layer 342 may be an organic light-emitting layer. The light-emitting layer 342 may emit one of red light, green light, and blue light. The peak wavelength of the red light may range from about 620 nm to 750 nm, the peak wavelength of the green light may range from about 495 nm to 570 nm, and the peak wavelength of the blue light may range from about 450 nm to 495 nm. Also, the light-emitting layer 342 may be a white light-emitting layer emitting white light, in which case, the light-emitting layer 342 may have a stack of red, green, and blue light-emitting layers and may be a common layer formed commonly for all pixels. In this case, the display panel 300 may further include color filters for displaying red, green, and blue colors.

The light-emitting layer 342 may include a hole transport layer, an emission layer, and an electron transport layer. The light-emitting layer 342 may have a tandem structure with two or more stacks, in which case, a charge generating layer may be formed between the stacks.

The cathode electrode 343 may be formed on the light-emitting layer 342. The cathode electrode 343 may be formed to cover the light-emitting layer 342. The cathode electrode 343 may be a common layer formed commonly for all pixels.

In a case where the light-emitting element layer 304 is formed as a top emission-type light-emitting element layer, the anode electrode 341 may be formed of a metal material with high reflectance such as a stack of Al and Ti (e.g., Ti/Al/Ti), a stack of Al and ITO (e.g., ITO/Al/ITO), a silver (Ag)-palladium (Pd)-copper (Cu) (APC) alloy, or a stack of an APC alloy and ITO (e.g., ITO/APC/ITO). The cathode electrode 343 may be formed of a transparent conductive oxide (TCO) material such as ITO or IZO that can transmit light therethrough or a semi-transmissive conductive material such as magnesium (Mg), Ag, or an alloy thereof. In a case where the cathode electrode 343 is formed of a semi-transmissive conductive material, the emission efficiency of the light-emitting element layer 304 may be improved due to a micro-cavity effect.

In a case where the light-emitting element layer 304 is formed as a bottom emission-type light-emitting element layer, the anode electrode 341 may be formed of a TCO material such as ITO or IZO or a semi-transmissive conductive material such as Mg, Ag, or an alloy thereof. The cathode electrode 343 may be formed of a metal material with high reflectance such as a stack of Al and Ti (e.g., Ti/Al/Ti), a stack of Al and ITO (e.g., ITO/Al/ITO), an APC alloy, or a stack of an APC alloy and ITO (e.g., ITO/APC/ITO). In a case where the anode electrode 341 is formed of a semi-transmissive conductive material, the emission efficiency of the light-emitting element layer 304 may be improved due to a micro-cavity effect.

The thin-film encapsulation layer 305 is formed on the light-emitting element layer 304. The thin-film encapsulation layer 305 prevents or reduces the penetration of oxygen or moisture into the light-emitting layer 342 and the cathode electrode 343. The thin-film encapsulation layer 305 may include at least one inorganic film. The inorganic film may be formed of silicon nitride, aluminum nitride, zirconium nitride, titanium nitride, hafnium nitride, tantalum nitride, silicon oxide, aluminum oxide, or titanium oxide. The thin-film encapsulation layer 305 may further include at least one organic film. The organic layer may be formed to a sufficient thickness to prevent or reduce particles from entering the light-emitting layer 342 and the cathode electrode 343 through the thin-film encapsulation layer 305. The organic film may include one of epoxy, acrylate, and urethane acrylate.

The display circuit board 310 may be attached to one side of the display panel 300. Specifically, one side of the display circuit board 310 may be attached to pads provided on one side of the display panel 300 via an anisotropic conductive film.

Figure 23A:
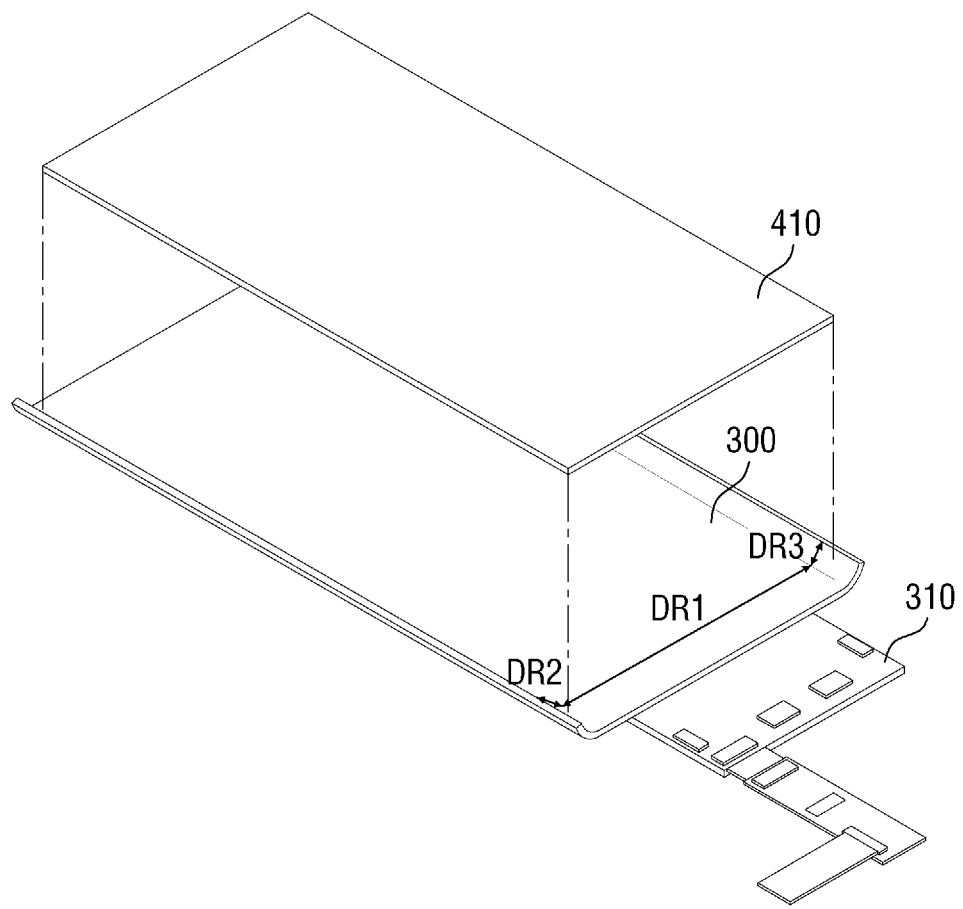
FIGS. 23A, 23B, 23C, 23D, and 23E are perspective views illustrating the method of manufacturing a display device constructed according to an exemplary embodiment.
Figure 23B:
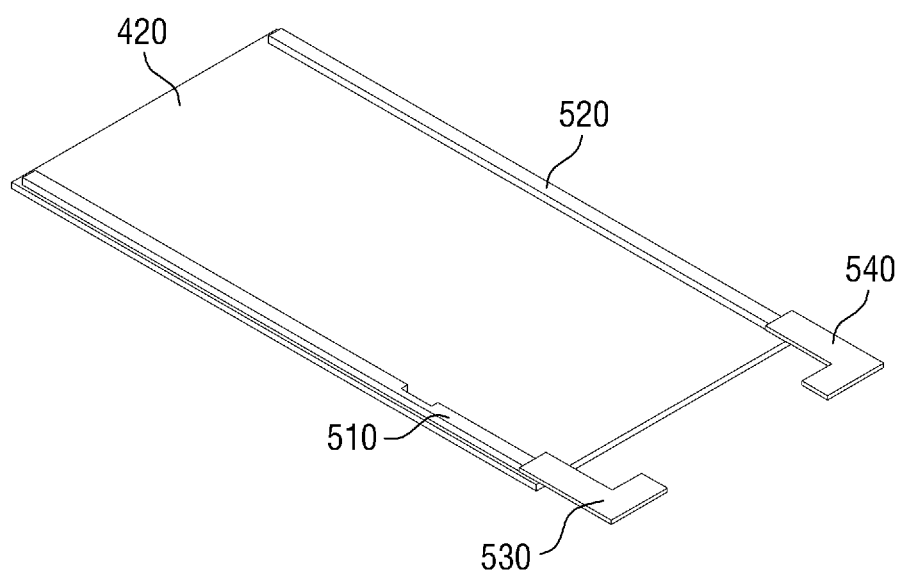
Figure 23C:
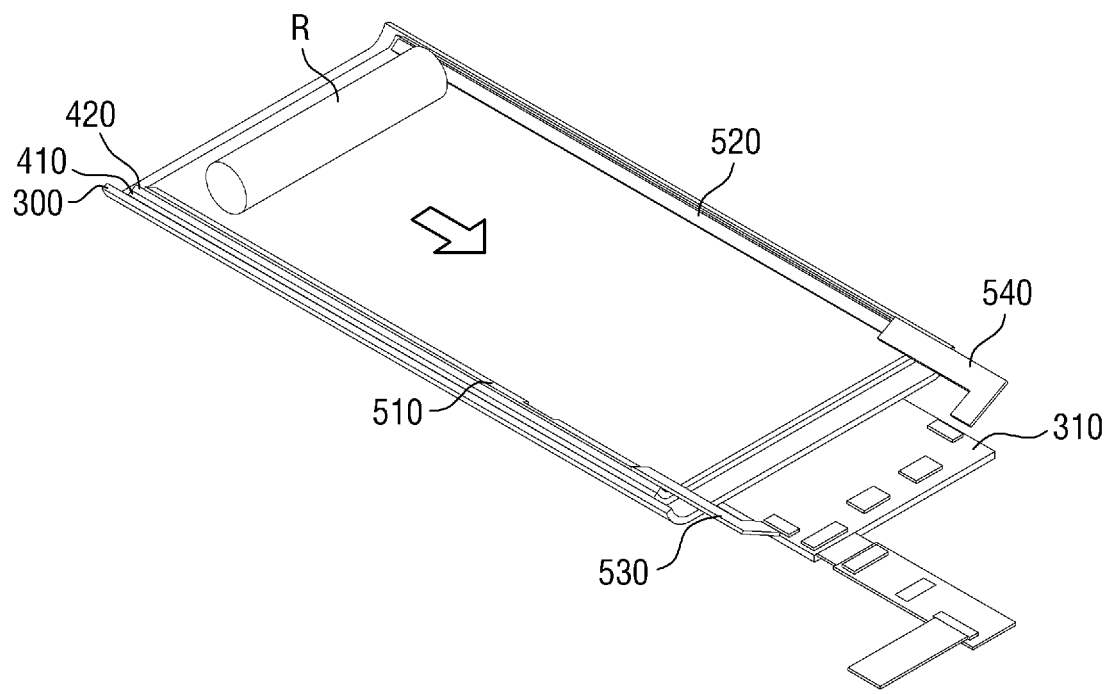
Figure 23D:
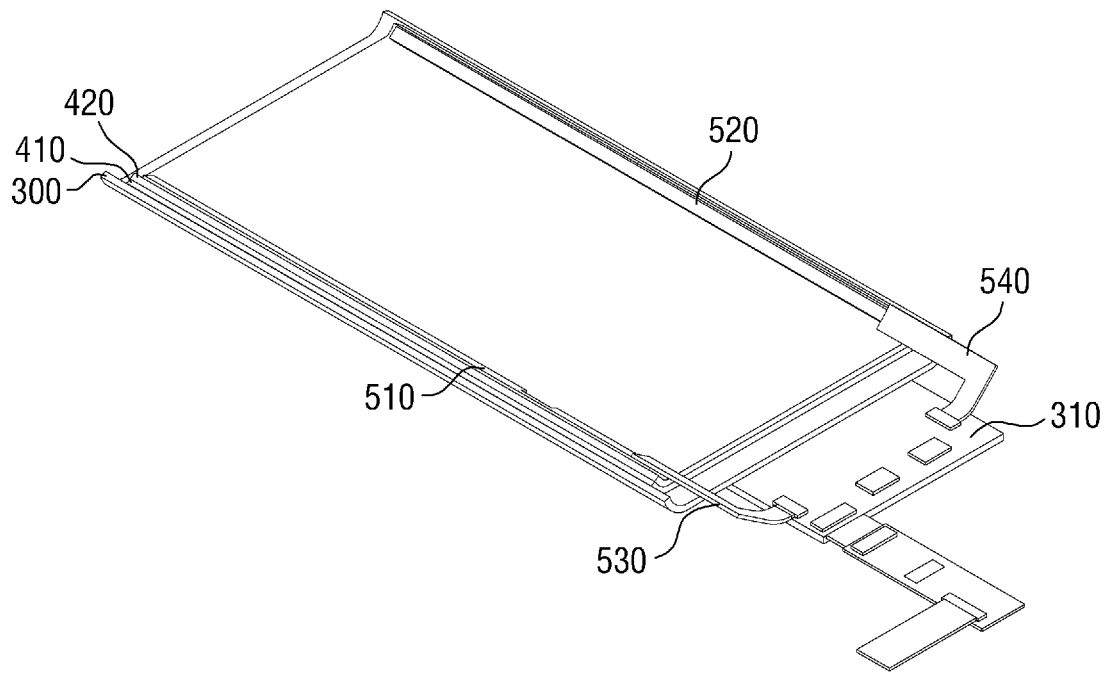
Figure 23E:
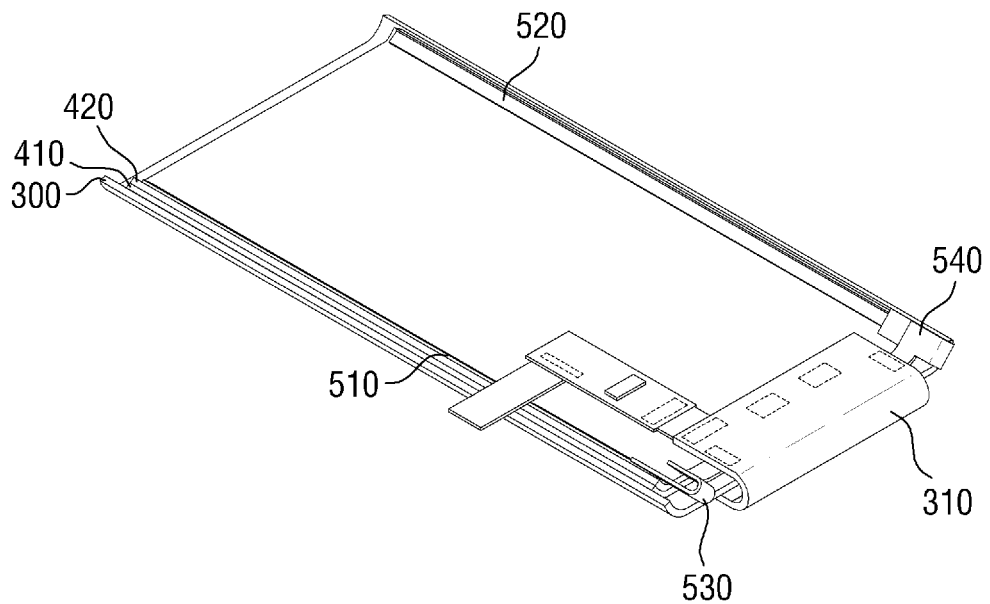

The display circuit board 310 may be bent at least once, as illustrated in FIG. 23E. The display circuit board 310 may be attached to the top or bottom surface of the display panel 300 and may be bent over the bottom of the display panel 300, particularly, over the bottom of the panel bottom member 400, as illustrated in FIG. 23E. The touch circuit board 210 may be attached to the top surface of the touch sensing device 200 and may be bent over the bottom of the display panel 300, particularly, over the bottom of the panel bottom member 400. As a result, the touch connecting portion disposed at one side of the touch circuit board 210 can be connected to the touch connector 312a of the display circuit board 310. The display circuit board 310 will be described later in detail with reference to FIGS. 3, 4, 5, and 6.

The display driving unit 320 outputs, via the display circuit board 310, signals and voltages for driving the display panel 300. The display driving unit 320 may be formed as an integrated circuit and may be mounted on the display circuit board 310, but the present disclosure is not limited thereto. For example, the display driving unit 320 may be attached directly to the display panel 300, in which case, the display driving unit 320 may be attached to the top surface or the bottom surface of the display panel 300.

The panel bottom member 400 may be disposed below the display panel 300. The panel bottom member 400 may be attached to the bottom surface of the display panel 300 via a third adhesive member 930, as illustrated in FIG. 7. The third adhesive member 930 may be an OCA, an OCR, a pressure sensitive adhesive (PSA).

The panel bottom member 400 may include at least one of a light-absorbing member for absorbing incident light from the outside, a buffer member for absorbing shock from the outside, a heat dissipation member for effectively releasing heat from the display panel 300, and a light-shielding layer for blocking incident light from the outside.

The light-absorbing member may be disposed below the display panel 300. The light-absorbing member blocks the transmission of light and can thus prevent or limit the elements disposed therebelow, i.e., the first force sensor 510, the second force sensor 520, the display circuit board 310, the first flexible circuit board 530, and the second flexible circuit board 540, from becoming visible from above the display panel 300. The light-absorbing member may include a light-absorbing material such as a black pigment or dye.

The buffer member may be disposed below the light-absorbing member. The buffer member absorbs external shock and can thus prevent or reduce the display panel 300 from being damaged. The buffer member may be formed as a single layer or as multiple layers. For example, the buffer member may include a polymer resin such as polyurethane, polycarbonate, polypropylene, or polyethylene or an elastic material such as a sponge obtained by foam-molding rubber, a urethane-based material or an acrylic material. The buffer member may be a cushion layer.

The heat dissipation member may be disposed below the buffer member. The heat dissipation member may include a first heat dissipation layer 410 including graphite or carbon nanotubes and a second heat dissipation layer 420 formed as a thin metal film using a metal having excellent thermal conductivity such as Cu, Ni, ferrite, or Ag, as illustrated in FIGS. 23A and 23B.

The first force sensor 510 may be disposed in the second area DR2, which corresponds to the first curved portion, and the second force sensor 520 may be disposed in the third area DR3, which corresponds to the second curved portion. That is, the first force sensor 510 may be disposed below the display panel 300 on the right side of the display panel 300, and the second force sensor 520 may be disposed below the display panel 300 on the left side of the display panel 300. The left and right sides of the display panel 300 are opposite to each other, as illustrated in FIGS. 1 and 2. The first and second force sensors 510 and 520 may be attached to the bottom surface of the panel bottom member 400.

Figure 9:
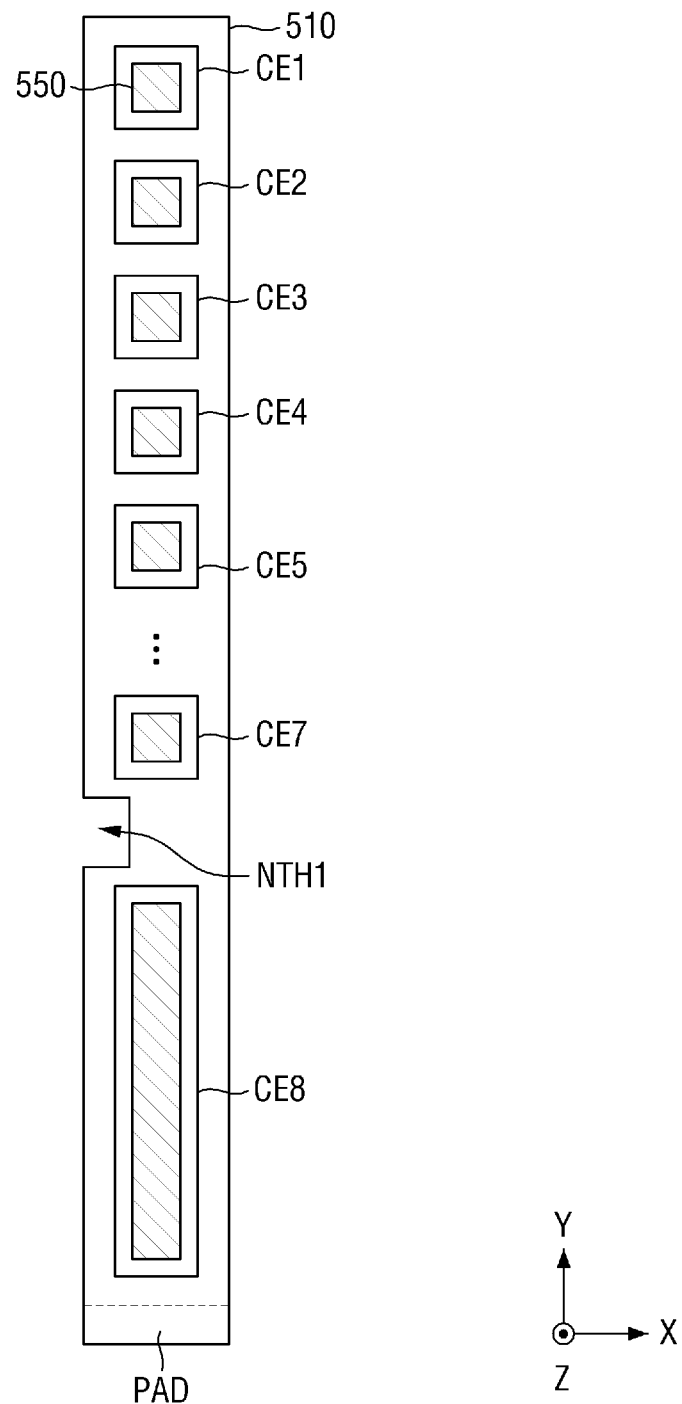
FIG. 9 is a plan view illustrating a first force sensor and first bumps of the display device constructed according to an exemplary embodiment.

First bumps 550 may be disposed on the first force sensor 510, as illustrated in FIGS. 7 and 9. Each of the first bumps 550 may be attached to the bottom surface of the panel bottom member 400 via a fourth adhesive member 940 and to the top surface of the first force sensor 510 via a sixth adhesive member 950. The first force sensor 510 may be attached to the top surface of the frame 600 via a fifth adhesive member 950. The fourth, fifth, and sixth adhesive members 940, 950, and 960 may be PSAs. One of the fourth and fifth adhesive members 940 and 950 may not be provided.

The first force sensor 510 may have a rectangular shape having short sides extending in the first direction (or the X-axis direction) and long sides extending in the second direction (or the Y-axis direction). The first force sensor 510 may be connected to the display circuit board 310 via the first flexible circuit board 530. The second force sensor 520 may be connected to the display circuit board 310 via the second flexible circuit board 540. The first and second flexible circuit boards 530 and 540 may be FPCBs.

Figure 3:
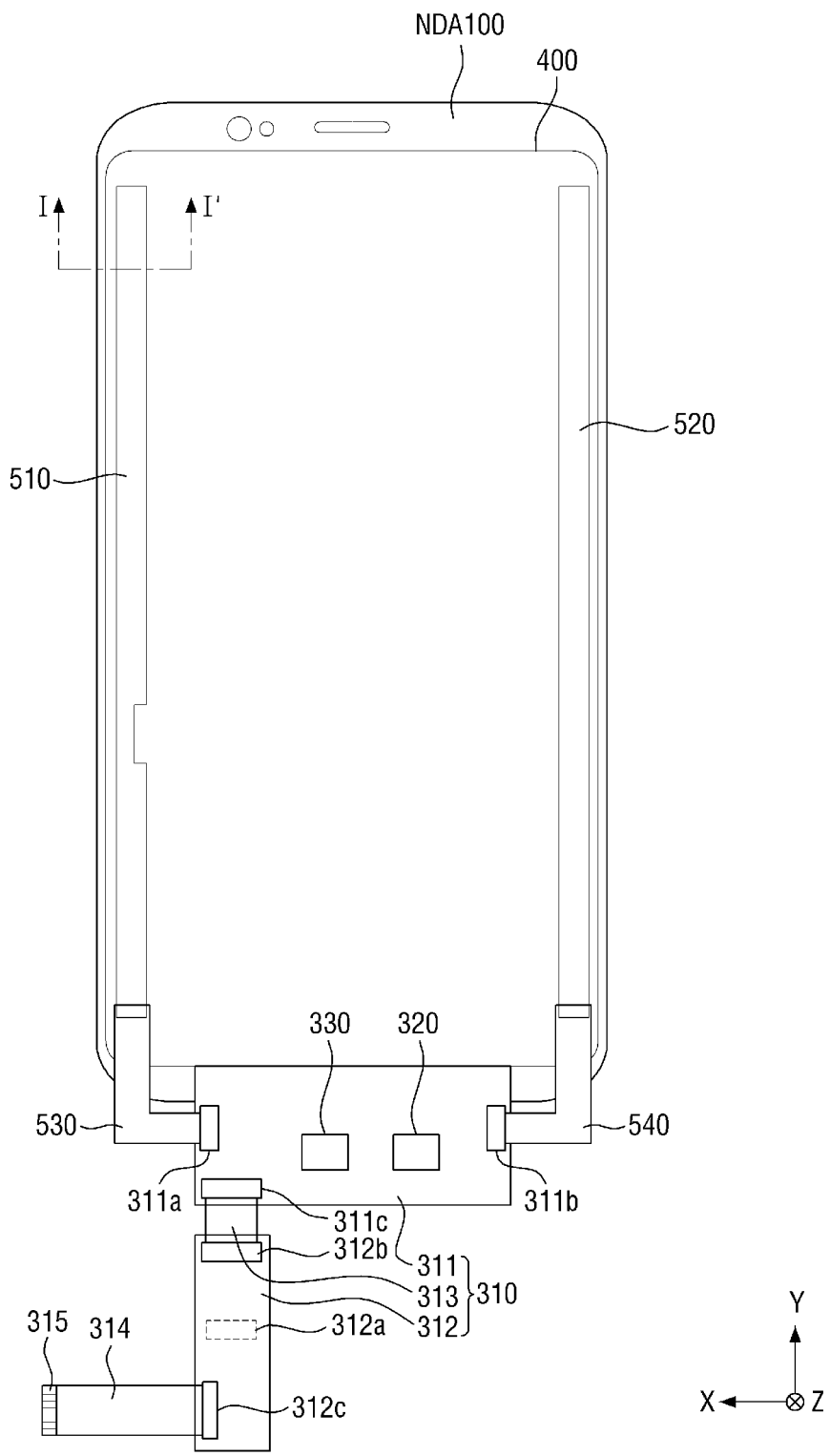
FIG. 3 is a bottom view illustrating an exemplary embodiment of a display panel attached to a cover window before bending a display circuit board, a first flexible circuit board, and a second flexible circuit board of FIG. 2 downwardly.

The force sensing unit 330, which is for detecting force (pressure) by driving the first and second force sensors 510 and 520, may be mounted on the display circuit board 310, as illustrated in FIGS. 3 and 4. In this case, the force sensing unit 330 may be formed as an integrated circuit. Also, the force sensing unit 330 may be incorporated into the display driving unit 320 and may then be formed as a single integrated circuit.

The first and second flexible circuit boards 530 and 540 may be connected to the touch circuit board 210, rather than to the display circuit board 310. In this case, the force sensing unit 330 may be mounted on the touch circuit board 210. Also, the force sensing unit 330 may be incorporated into the touch circuit board 210 and may then be formed as a single integrated circuit.

The frame 600 may be disposed below the panel bottom member 400. The frame 600 may include a synthetic resin, a metal or both.

The waterproof member 610 may be disposed along the edges of the frame 600. The waterproof member 610 may be attached to the top surface of the panel bottom member 400 and the bottom surface of the frame 600. To this end, the waterproof member 610 may include a base film, a first adhesive film disposed on one surface of the base film, and a second adhesive film disposed on the other surface of the base film. The base film may include PET, PET and a cushion layer, or polyethylene (PE) foam. The first and second adhesive films may be PSAs. The first adhesive film may be attached to the bottom surface of the panel bottom member 400, and the second adhesive film may be attached to the top surface of the frame 600.

The waterproof member 610 may be disposed adjacent to the first force sensor 510 and may also be disposed adjacent to the second force sensor 520. For example, the waterproof member 610 may be disposed on the outside of the first force sensor 510 and on the outside of the second force sensor 520, as illustrated in FIG. 7. Here, the outside of the first force sensor 510 refers to the outside of the right side of the first force sensor 510, and the outside of the second force sensor 520 refers to the outside of the left side of the second force sensor 510. Also, since the first and second force sensors 510 and 520 are waterproof and dustproof without the aid of the waterproof member 610, the waterproof member 610 may be disposed on the inside of the first force sensor 510 and on the inside of the second force sensor 520. Here, the inside of the first force sensor 510 refers to the outside of the left side of the first force sensor 510, and the inside of the second force sensor 520 refers to the outside of the right side of the second force sensor 510.

If the height of the waterproof member 610 is smaller than the sum of the height of the first force sensor 510 and the height of the first bumps 550, the first force sensor 510 may be damaged by a force for attaching the waterproof member 610. Thus, the height of the waterproof member 610 may preferably be greater than the sum of the height of the first force sensor 510 and the height of the first bumps 550. However, if the height of the waterproof member 610 is too much greater than the sum of the height of the first force sensor 510 and the height of the first bumps 550, the first force sensor 510 may not be able to properly detect force. Thus, the height of the waterproof member 610 may be experimentally determined in advance in consideration of both damage that may be caused to the first force sensor 510 by the force for attaching the waterproof member 610 and the first force sensor 510 and the ability of the first force sensor 510 to detect force.

The height of the first bumps 550 may preferably be greater than the height of the first force sensor 510 in order for the first bumps 550 to properly pressurize force sensing cells CE1, CE2, CE3, CE4, CE5, CE6, CE7, and CE8 of the first force sensor 510 in accordance with force input from the user.

According to the exemplary embodiment of FIGS. 1 and 2, since the waterproof member 610 is disposed adjacent to both the first and second force sensors 510 and 520, the waterproof member 610 can prevent or reduce the penetration of moisture or dust through the gap between the display panel 300 and the frame 600. That is, a display device 10 that is waterproof and dustproof can be provided.

A first camera hole CMH1 in which a camera device 720 is inserted, a battery hole BH which is for releasing heat from a battery, and a cable hole CAH through which a second connection cable 314 is connected to the display circuit board 310 may be formed in the frame 600. Specifically, the cable hole CAH may be disposed adjacent to the right side of the frame 600. In this case, the cable hole CAH may be hidden by the first force sensor 510, which is disposed below the panel bottom member 400 on the right side of the display panel 300. Accordingly, the first force sensor 510 may include a recess NTH1, which is formed on one side of the force sensor 510 as a notch not to hide, but to expose, the cable hole CAH.

The frame 600 is disposed below the panel bottom member 400 of the display panel 300 and below the first force sensor 510, and the second force sensor 520. The frame 600 may support the first and second force sensors 510 and 520 when force is applied to the first and second force sensors 510 and 520. Accordingly, the first and second force sensors 510 and 520 can detect force applied thereto.

The main circuit board 700 may be disposed below the frame 600. The main circuit board 700 may be a printed circuit board (PCB) or an FPCB.

The main circuit board 700 may include a main processor 710, the camera device 720, and a main connector 730. The main processor 710 and the main connector 730 may be disposed on the bottom surface of the main circuit board 700 to face the lower cover 900. The camera device 720 may be disposed on both the top surface and the bottom surface of the main circuit board 700.

The main processor 710 may control all the functions of the display device 10. For example, the main processor 710 may output image data to the display driving unit 320 of the display circuit board 310 so as for the display panel 300 to display an image. Also, the main processor 710 may receive touch data from the touch driving unit 220, may determine the location of touch input from the user, and may execute an application corresponding to an icon displayed at the location of the touch input. Also, the main processor 710 may receive force sensing data from the force sensing unit 330 and may execute an application corresponding to an icon displayed at the location of force input from the user according to the force sensing data. The main processor 710 causes a vibration generating device 901 to vibrate according to the force sensing data and thus to provide haptic feedback. The main processor 710 may be an application processor a central processing unit, or a system chip, which consists of an integrated circuit.

The camera device 720 processes image frames provided by an image sensor in a camera mode, such as a still image or a moving image, and outputs the processed image frames to the main processor 710.

The second connection cable 314, which passes through the cable hole CAH of the frame 600, may be connected to the main connector 730 of the main circuit board 700 through the gap between the frame 600 and the main circuit board 700. As a result, the main circuit board 700 can be electrically connected to the display circuit board 310 and the touch circuit board 210.

A mobile communication module, which can exchange wireless signals with at least one of a base station, an external terminal, and a server via a mobile communication network, may be further provided on the main circuit board 700. The wireless signals may include various types of data associated with the transmission/reception of audio signals, video call signals, or text/multimedia messages. Also, a sound output device capable of outputting sounds such as a speaker may be further provided on the main circuit board 700.

The lower cover 900 may be disposed below the frame 600 and the main circuit board 700. The lower cover 900 may be coupled or fixed to the frame 600. The lower cover 900 may form the bottom exterior of the display device 10. The lower cover 900 may include plastic and/or a metal.

A second camera hole CMH2, in which the camera device 720 is inserted to protrude outwardly, may be formed in the lower cover 900. The location of the camera device 720 and the locations of the first and second camera holes CMH1 and CMH2 corresponding to the camera device 720 are not limited to what is shown in FIGS. 1, 2, 4, and 5.

The vibration generating device 901 may be disposed on the top surface of the lower cover 900 and may be connected to the main circuit board 700. As a result, the vibration generating device 901 may vibrate in response to a vibration signal from the main processor 710. The vibration generation device 901 may be one of an eccentric rotating mass (ERM), a linear resonant actuator (LRA), and a piezoelectric actuator.

Figure 5:
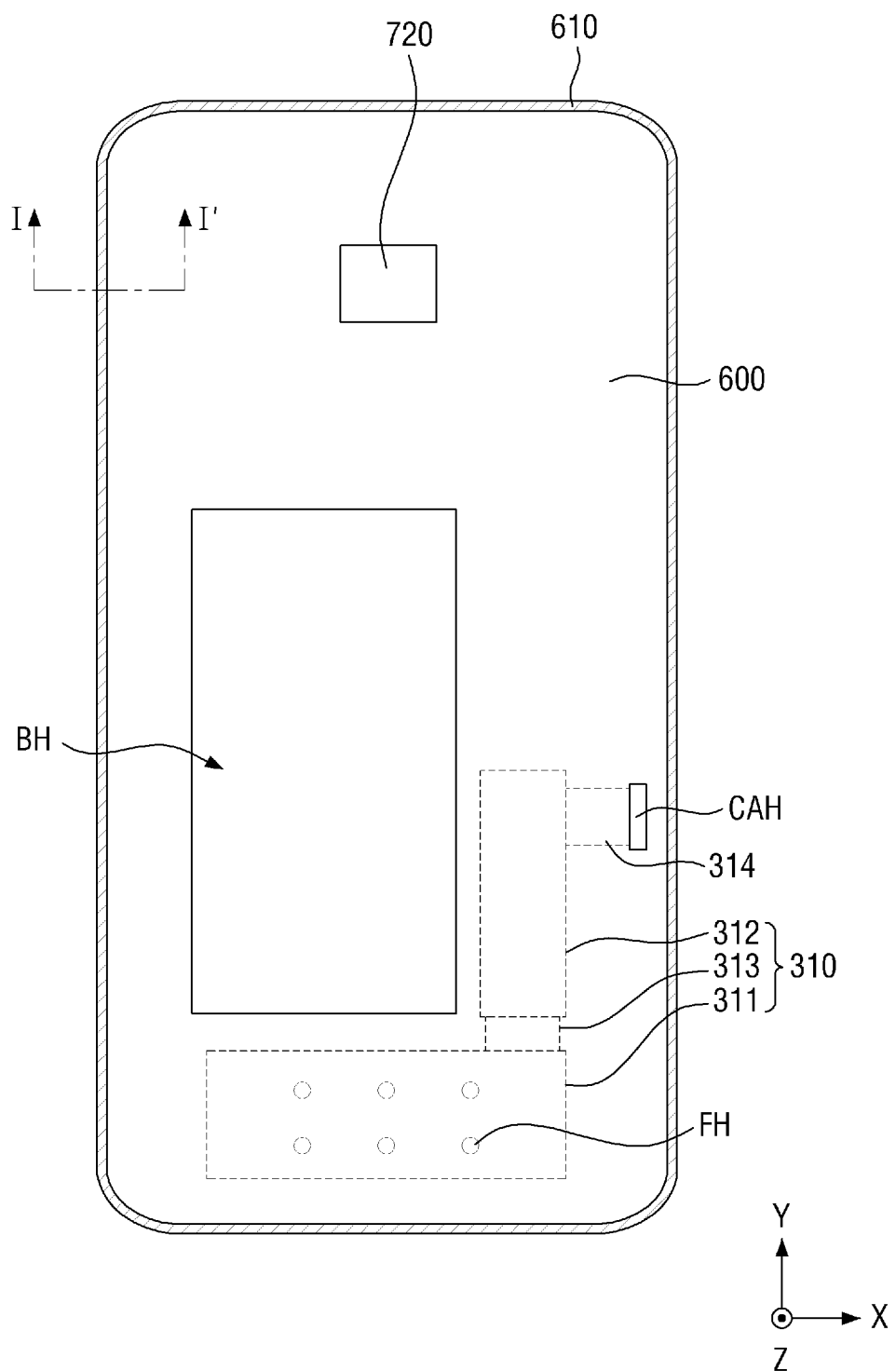
FIG. 5 is a plan view illustrating a frame of FIG. 2.
Figure 6:
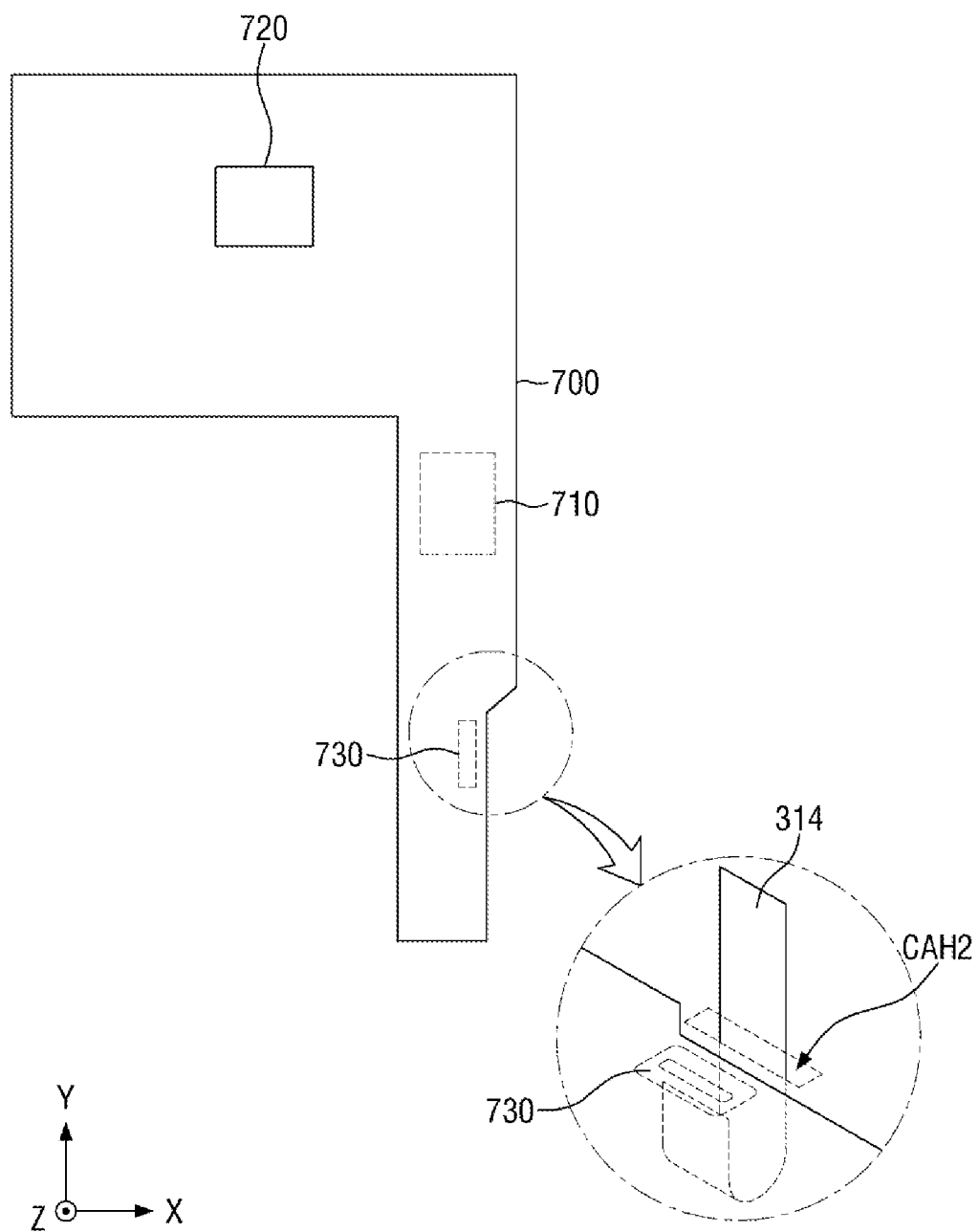
FIG. 6 is a plan view illustrating a main circuit board of FIG. 2.

FIG. 3 is a bottom view illustrating an exemplary embodiment of the display panel 300 attached to a cover window 100 before bending the display circuit board 310, the first flexible circuit board 530, and the second flexible circuit board 540 of FIG. 2 downwardly. FIG. 4 is a bottom view illustrating an exemplary embodiment of the display panel 300 attached to the cover window 100 after bending the display circuit board 310, the first flexible circuit board 530, and the second flexible circuit board 540 of FIG. 2 downwardly. FIG. 5 is a plan view illustrating the frame 600 of FIG. 2. FIG. 6 is a plan view illustrating the main circuit board 700 of FIG. 2.

It will hereinafter be described, with reference to FIGS. 3, 4, 5, and 6, how the first force sensor 510 and the display circuit board 310 are connected using the first flexible circuit board 530, how the second force sensor 520 and the display circuit board 310 are connected using the second flexible circuit board 540, and how the display circuit board 310 and the main circuit board 700 are connected using the second connection cable 314. FIGS. 3 and 4 are bottom views in plan views, unlike in FIGS. 5 and 6, and therefore, the display device 10 is reversed left to right. For convenience, in FIG. 5, the display circuit board 310 is illustrated with dotted lines, and in FIG. 6, the second connection cable 314 is illustrated with dotted lines.

Referring to FIGS. 3, 4, 5, and 6, the display circuit board 310 may include a first circuit board 311, a second circuit board 312, and a first connection cable 313.

The first circuit board 311 may be attached to one side of the top or bottom surface of the substrate of the display panel 300 and may be bent over the bottom of the panel bottom member 400, as illustrated in FIG. 23E. As illustrated in FIG. 4, the first circuit board 311 may be fixed into fixing holes FH, which are formed in the frame 600, by fixing members.

The first circuit board 311 may include the display driving unit 320, the force sensing unit 330, a first connector 311*a*, a second connector 311*b*, and a third connector 311*c*. The display driving unit 320, the force sensing unit 330, the first connector 311*a*, the second connector 311*b*, and the third connector 311*c* may be disposed on one surface of the first circuit board 311.

The first connector 311*a* may be connected to a connector connecting portion provided at one end of the first flexible circuit board 530, which is connected to the first force sensor 510. As a result, the first force sensor 510 can be electrically connected to the force sensing unit 330.

The second connector 311*b* may be connected to a connector connecting portion provided at one end of the second flexible circuit board 540, which is connected to the second force sensor 520. As a result, the second force sensor 520 can be electrically connected to the force sensing unit 330.

The third connector 311*c* may be connected to a first end of the first connection cable 313 connected to the second circuit board 312. As a result, the display driving unit 320 and the force sensing unit 330, which are mounted on the first circuit board 311, can be electrically connected to the second circuit board 312 via the first connection cable 313.

The second circuit board 312 may include the touch connector 312*a*, a first connection connector 312*b*, and a second connection connector 312*c*. The first and second connection connectors 312*b* and 312*c* may be disposed on one surface of the second circuit board 312, and the touch connector 312a may be disposed on the other surface of the second circuit board 312.

The touch connector 312a may be connected to the touch connecting portion provided at one end of the touch circuit board 210. As a result, the touch driving unit 220 can be electrically connected to the second circuit board 312.

The first connection connector 312b may be connected to a second end of the first connection cable 313 connected to the first circuit board 311. As a result, the display driving unit 320, which is mounted on the first circuit board 311, can be electrically connected to the second circuit board 312 via the first connection cable 313.

The second connection connector 312c may be connected to a first end of the second connection cable 314 connected to the main connector 730 of the main circuit board 700. As a result, the second circuit board 312 can be electrically connected to the second circuit board 312 via the second connection cable 314.

A connector connecting portion 315 may be formed at a second end of the second connection cable 314. As illustrated in FIGS. 4 and 5, the connector connecting portion 315 of the second connection cable 314 may extend to the bottom of the frame 600 through the cable hole CAH of the frame 600. Since the recess NTH1, which is in the shape of a notch, is formed on one side of the first force sensor 510 to correspond to the cable hole CAH of the frame 600, the cable hole CAH of the frame 600 can be exposed, instead of being covered by the first force sensor 510.

Also, as illustrated in FIG. 6, a gap is formed between the frame 600 and the main circuit board 700, and the connector connecting portion 315 of the second connection cable 314 passing through the cable hole CAH may extend to the bottom of the main circuit board 700 through the gap between the frame 600 and the main circuit board 700. Finally, the connector connecting portion 315 of the second connection cable 314 may be connected to the main connector 730, which is disposed on the bottom surface of the main circuit board 700.

According to the exemplary embodiment of FIGS. 3, 4, 5, and 6, the recess NTH1 is formed on one side of the first force sensor 510 as a notch not to block the cable hole CAH of the frame 600. Accordingly, the second connection cable 314, which is connected to the display circuit board 310, may extend to the bottom of the frame 600 through the cable hole CAH and may thus be connected to the main connector 730 of the main circuit board 700. Accordingly, the display circuit board 310 and the main circuit board 700 can be stably connected.

The first flexible circuit board 530 electrically connects the first force sensor 510 and the display circuit board 310. A first end of the first flexible circuit board 530 may be connected to the first connector 311a of the display circuit board 310. To this end, a connector connecting portion may be provided at the first end of the first flexible circuit board 530. A second end of the first flexible circuit board 530 may be connected to a pad unit PAD provided at the first force sensor 510. The second end of the first flexible circuit board 530 may be attached on the pad unit PAD of the first force sensor 510.

Specifically, the first force sensor 510 may have a rectangular shape having short sides extending in the first direction (or the X-axis direction) and long sides extending in the second direction (or the Y-axis direction), in which case, the pad unit PAD of the first force sensor 510 may be disposed at an end, in the second direction (or the Y-axis direction), of the first force sensor 510. For example, the pad unit PAD of the first force sensor 510 may be disposed at a lower end, in the second direction (or the Y-axis direction), of the first force sensor 510.

The first flexible circuit board 530 may be connected to the first connector 311a of the display circuit board 310 when the display circuit board 310 is unfolded, as illustrated in FIG. 3, instead of being bent over the bottom of the display panel 300. Accordingly, the first flexible circuit board 530 may have a curved shape such as an L shape. That is, the first flexible circuit board 530 may be formed to extend from the end of the first force sensor 510 along the second direction (or the Y-axis direction) and to be bent toward the display circuit board 310 along the first direction (or the X-axis direction).

The second flexible circuit board 540 electrically connects the second force sensor 520 and the display circuit board 310. A first end of the second flexible circuit board 540 may be connected to the second connector 311b of the display circuit board 310. To this end, a connector connecting portion may be provided at the first end of the second flexible circuit board 540. A second end of the second flexible circuit board 540 may be connected to a pad unit provided at the second force sensor 520. The second end of the second flexible circuit board 540 may be attached on the pad unit of the second force sensor 520.

Specifically, the second force sensor 520 may have a rectangular shape having short sides extending in the first direction (or the X-axis direction) and long sides extending in the second direction (or the Y-axis direction), in which case, the pad unit of the second force sensor 520 may be disposed at an end, in the second direction (or the Y-axis direction), of the second force sensor 520. For example, the pad unit of the second force sensor 520 may be disposed at a lower end, in the second direction (or the Y-axis direction), of the second force sensor 520.

The second flexible circuit board 540 may be connected to the second connector 311b of the display circuit board 310 when the display circuit board 310 is unfolded, as illustrated in FIG. 3, instead of being bent over the bottom of the display panel 300. Accordingly, the second flexible circuit board 540 may have a curved shape such as an L shape. That is, the second flexible circuit board 540 may be formed to extend from the end of the second force sensor 520 along the second direction (or the Y-axis direction) and to be bent toward the display circuit board 310 along the direction opposite to the first direction (or the X-axis direction).

The display circuit board 310, the first flexible circuit board 530, and the second flexible circuit board 540 may be bent at least once, as illustrated in FIGS. 4 and 23E. Specifically, after the first and second flexible circuit boards 530 and 540 are connected to the first and second connectors 311a and 311b, respectively, of the display circuit board 310, the display circuit board 310, the first flexible circuit board 530, and the second flexible circuit board 540 may be bent over the bottom of the display panel 300, particularly, over the bottom of the panel bottom member 400, as illustrated in FIGS. 4 and 23E, and may then be fixed.

In this case, the first end of the first flexible circuit board 530 is attached to the pad unit PAD of the first force sensor 510, but the second end of the first flexible circuit board 530 may be disposed below the panel bottom member 400 because the first flexible circuit board 530 is bent over the bottom of the panel bottom member 400. Similarly, the first end of the second flexible circuit board 540 is attached to the pad unit of the second force sensor 520, but the second end of the second flexible circuit board 540 may be disposed below the panel bottom member 400 because the second flexible circuit board 540 is bent over the bottom of the panel bottom member 400. Similarly, one side of the display circuit board 310 may be attached on the top surface or the bottom surface of the display panel 300, but the other side of the display circuit board 310 may be disposed below the panel bottom member 400 because the display circuit board 310 is bent over the panel bottom member 400.

According to the exemplary embodiment of FIGS. 3, 4, 5, and 6, the first force sensor 510 can be connected to the display circuit board 310 via the first flexible circuit board 530, and the second force sensor 520 can be connected to the display circuit board 310 via the second flexible circuit board 540. Accordingly, the first and second force sensors 510 and 520 can be electrically connected stably to the force sensing unit 330 of the display circuit board 310.

FIG. 9 is a plan view illustrating the first force sensor and the first bumps 550 of the display device constructed according to an exemplary embodiment of the present disclosure.

Referring to FIG. 9, the first force sensor 510 may have a rectangular shape having short sides extending in the first direction (or the X-axis direction) and long sides extending in the second direction (or a Y-axis direction). However, the shape of the first force sensor 510 is not particularly limited, but may vary depending on the location of the first force sensor 510.

The first force sensor 510 may include a plurality of first through eighth force sensing cells CE1, CE2, CE3, CE4, CE5, CE6, CE7, and CE8. FIG. 9 illustrates the first force sensor 510 as including eight force sensing cells, but the number of force sensing cells of the first force sensor 510 is not particularly limited.

The first through eighth force sensing cells CE1, CE2, CE3, CE4, CE5, CE6, CE7, and CE8 may independently detect the pressure at their respective locations. FIG. 9 illustrates the first through eighth force sensing cells CE1, CE2, CE3, CE4, CE5, CE6, CE7, and CE8 as being arranged in a single column, but the present disclosure is not limited thereto. The first through eighth force sensing cells CE1, CE2, CE3, CE4, CE5, CE6, CE7, and CE8 may be arranged in multiple columns as necessary. The first through eighth force sensing cells CE1, CE2, CE3, CE4, CE5, CE6, CE7, and CE8 may be a predetermined distance apart from one another, as illustrated in FIG. 9, or may be disposed continuously.

The first through eighth force sensing cells CE1, CE2, CE3, CE4, CE5, CE6, CE7, and CE8 may have different areas depending on the purpose of use. For example, referring to FIG. 13, the first through seventh force sensing cells CE1, CE2, CE3, CE4, CE5, CE6, and CE7 may be used as physical buttons such as volume control buttons VB+ and VB− and a power button PB, which are disposed on one side of the display device 10. For example, referring to FIG. 14, the eighth force sensing cell CE8 may be used as a button for detecting squeezing pressure from the user. In this case, the eighth force sensing cell CE8 may be formed to have a larger area than the first through seventh force sensing cells CE1, CE2, CE3, CE4, CE5, CE6, and CE7. The eighth force sensing cell CE8 may be formed to have a greater length in the length direction of the first force sensor 510 (or in the Y-axis direction) than the first through seventh force sensing cells CE1, CE2, CE3, CE4, CE5, CE6, and CE7.

FIG. 9 illustrates the first through seventh force sensing cells CE1, CE2, CE3, CE4, CE5, CE6, and CE7 as having the same area, but the present disclosure is not limited thereto. The first through seventh force sensing cells CE1, CE2, CE3, CE4, CE5, CE6, and CE7 may have different areas. Also, some of the first through seventh force sensing cells CE1, CE2, CE3, CE4, CE5, CE6, and CE7 may have the same area, and the other force sensing cells may have the same area, but a different area from the rest of the first through seventh force sensing cells CE1, CE2, CE3, CE4, CE5, CE6, and CE7.

The first bumps 550 may be disposed on the first through eighth force sensing cells CE1, CE2, CE3, CE4, CE5, CE6, CE7, and CE8 to overlap with the first through eighth force sensing cells CE1, CE2, CE3, CE4, CE5, CE6, CE7, and CE8. The first bumps 550 may pressurize the first through eighth force sensing cells CE1, CE2, CE3, CE4, CE5, CE6, CE7, and CE8 in accordance with input from the user. Accordingly, the input from the user can be detected by the first through eighth force sensing cells CE1, CE2, CE3, CE4, CE5, CE6, CE7, and CE8.

In order to raise force applied by the first bumps 550 to the first through eighth force sensing cells CE1, CE2, CE3, CE4, CE5, CE6, CE7, and CE8, the first bumps 550 may be formed to have a smaller area than the first through eighth force sensing cells CE1, CE2, CE3, CE4, CE5, CE6, CE7, and CE8. The first bumps 550 may be formed to have a smaller area than a force sensing layer PSL of each of the first through eighth force sensing cells CE1, CE2, CE3, CE4, CE5, CE6, CE7, and CE8.

The area of the first bumps 550 may be proportional to the area of force sensing cells. For example, referring to FIG. 9, in a case where the eighth force sensing cell CE8 has a larger area than the first through seventh force sensing cells CE1, CE2, CE3, CE4, CE5, CE6, and CE7, the area of the first bump 530 overlapping with the eighth force sensing cell CE8 may be greater than the area of the first bumps 550 overlapping with the first through seventh force sensing cells CE1, CE2, CE3, CE4, CE5, CE6, and CE7.

In order not to block the cable hole CAH of the frame 600, the recess NTH1 may be formed as a notch to correspond to the cable hole CAH of the frame 600.

The first force sensor 510 further includes the pad unit PAD, and the pad unit PAD includes a plurality of pads connected to a driving line TL and first through eighth sensing lines RL1, RL2, RL3, RL4, RL5, RL6, RL7, and RL8, which are connected to the first through eighth force sensing cells CE1, CE2, CE3, CE4, CE5, CE6, CE7, and CE8. The pad unit PAD may be disposed at one end, in the second direction (or the Y-axis direction), of the first force sensor 510.

The second force sensor 520 and second bumps 540 are almost the same as the first force sensor 510 and the first bumps 550, respectively, of FIG. 9, except that the second force sensor 520 does not include the recess NTH1, and thus, detailed descriptions thereof will be omitted.

FIG. 10 is a plan view illustrating an area A of FIG. 9. FIG. 11 is a cross-sectional view taken along a sectional line II-IF of FIG. 10.

Referring to FIGS. 10 and 11, the first force sensor 510 includes a first substrate SUB1, a second substrate SUB2, the driving line TL, the first through fifth sensing lines RL1, RL2, RL3, RL4, and RL5, and the first through eighth force sensing cells CE1, CE2, CE3, CE4, CE5, CE6, CE7, and CE8.

For convenience, only the fourth and fifth force sensing cells CE4 and CE5 and the first through fifth sensing lines RL1, RL2, RL3, RL4, and RL5, which are connected to the first through fifth force sensing cells CE1 through CE5, are illustrated in FIGS. 10 and 11. Also, for convenience, the second substrate SUB2 is not illustrated in FIG. 10.

The first and second substrates SUB1 and SUB2 are disposed to face each other. The first and second substrates SUB1 and SUB2 may include polyethylene, polyimide, polycarbonate, polysulfone, polyacrylate, polystyrene, polyvinyl chloride, polyvinyl alcohol, polynorbornene, or polyester. In one exemplary embodiment, the first and second substrates SUB1 and SUB2 may be formed as polyethylene terephthalate (PET) or polyimide films.

The first through eighth force sensing cells CE1, CE2, CE3, CE4, CE5, CE6, CE7, and CE8 are disposed between the first and second substrates SUB1 and SUB2. The driving line TL, the first through fifth sensing lines RL1, RL2, RL3, RL4, and RL5, a driving pad, and sensing pads are disposed on a surface of the first substrate SUB1 facing the second substrate SUB2. The first through eighth force sensing cells CE1, CE2, CE3, CE4, CE5, CE6, CE7, and CE8 are disposed between the first and second substrates SUB1 and SUB2.

Each of the first through eighth force sensing cells CE1, CE2, CE3, CE4, CE5, CE6, CE7, and CE8 may be connected to one driving line and at least one sensing line. For example, the first through eighth force sensing cells CE1, CE2, CE3, CE4, CE5, CE6, CE7, and CE8 may all be connected to the same driving line, i.e., the driving line TL, and may be connected to the first through eighth sensing lines RL1, RL2, RL3, RL4, RL5, RL6, RL7, and RL8, respectively. Referring to FIG. 10, the fourth force sensing cell CE4 may be connected to the driving line T1 and the fourth sensing line RL4, and the fifth force sensing cell CE5 may be connected to the driving line T1 and the fifth sensing line RL5. The driving line TL may be connected to the driving pad, and the first through fifth sensing lines RL1, RL2, RL3, RL4, and RL5 may be connected to their respective sensing pads.

In the pad unit PAD, the driving pad and the sensing pads may be disposed. The driving pad may be connected to a driving lead line of the first flexible circuit board 530, and the sensing pads may be connected to their respective sensing lead lines of the first flexible circuit board 530. Since the first flexible circuit board 530 is connected to the display circuit board 310, the first flexible circuit board 530 can be electrically connected to the force sensing unit 330, which is mounted on the display circuit board 310. The force sensing unit 330 can detect force applied to the first through eighth force sensing cells CE1, CE2, CE3, CE4, CE5, CE6, CE7, and CE8 by applying a driving voltage to the driving line TL via the driving pad and detecting current or voltage values from the first through fifth sensing lines RL1, RL2, RL3, RL4, and RL5 via the sensing pads.

The first force sensor 510 may further include a bonding layer AHL, which is disposed between the first and second substrates SUB1 and SUB2 and couples the first and second substrates SUB1 and SUB2 together. The bonding layer AHL may be formed as a PSA layer. The bonding layer AHL may be disposed along the edges of each of the first and second substrates SUB1 and SUB2. In one exemplary embodiment, the bonding layer AHL may completely surround the edges of each of the first and second substrates SUB1 and SUB2 and may thus seal the inside of the first force sensor 510. Also, the bonding layer AHL may serve as a spacer for uniformly maintaining the gap between the first and second substrates SUB1 and SUB2. The bonding layer AHL may not be formed in the pad unit PAD and may not overlap with the driving line TL, the first through eighth sensing lines RL1, RL2, RL3, RL4, RL5, RL6, RL7, and RL8, the first through eighth force sensing cells CE1, CE2, CE3, CE4, CE5, CE6, CE7, and CE8, the driving pad, and the sensing pads, but the present disclosure is not limited thereto. The bonding layer AHL may overlap with the driving line TL, the first through eighth sensing lines RL1, RL2, RL3, RL4, RL5, RL6, RL7, and RL8, the first through eighth force sensing cells CE1, CE2, CE3, CE4, CE5, CE6, CE7, and CE8, the driving pad, and the sensing pads.

The bonding layer AHL may be attached to one surface of one of the first and second substrates SUB1 and SUB2 first and may then be attached to one surface of the other substrate in the process of bonding the first and second substrates SUB1 and SUB2 together. Separate bonding layers AHL may be provided on the first and substrates SUB1 and SUB2 and may be bonded to each other in the process of bonding the first and second substrates SUB1 and SUB2 together.

As illustrated in FIG. 11, each of the first through eighth force sensing cells CE1, CE2, CE3, CE4, CE5, CE6, CE7, and CE8 includes a driving connecting electrode TCE, a sensing connecting electrode RCE, driving electrodes TE1, sensing electrodes RE1, and a force sensing layer PSL.

The driving connecting electrode TCE, the sensing connecting electrode RCE, the driving electrodes TE1, and the sensing electrodes RE1 are disposed on a surface of the first substrate SUB1 facing the second substrate SUB2.

The driving connecting electrode TCE is connected to the driving line TL and the driving electrodes TE1. Specifically, the driving connecting electrode TCE is connected to the driving line TL at one end of the driving connecting electrode TCE in the lengthwise direction of the driving connecting electrode TCE (or in the Y-axis direction). The driving electrodes TE1 may be branched off from the driving connecting electrode TCE in the widthwise direction of the driving connecting electrode TCE (or in the X-axis direction).

The sensing connecting electrode RCE is connected to one of the first through eighth sensing lines RL1, RL2, RL3, RL4, RL5, RL6, RL7, and RL8. Specifically, the sensing connecting electrode RCE may be connected to one of the first through eighth sensing lines RL1, RL2, RL3, RL4, RL5, RL6, RL7, and RL8 at one end of the sensing connecting electrode RCE in the lengthwise direction of the sensing connecting electrode RCE. The sensing electrodes RE1 may be branched off from the sensing connecting electrode RCE in the widthwise direction of the sensing connecting electrode RCE (or in the X-axis direction).

The driving electrodes TE1 and the sensing electrodes RE1 may be disposed on the same layer. The driving electrodes TE1 and the sensing electrodes RE1 may be formed of the same material. For example, the driving electrodes TE1 and the sensing electrodes RE1 may include a conductive material such as Ag or Cu. The driving electrodes TE1 and the sensing electrodes RE1 may be formed on the first substrate SUB1 through screen printing.

The driving electrodes TE1 and the sensing electrodes RE1 may be disposed adjacent to each other, but may not be connected to each other. The driving electrodes TE1 and the sensing electrodes RE1 may be disposed in parallel to each other. The driving electrodes TE1 and the sensing electrodes RE1 may be alternately arranged in the lengthwise direction of the driving connecting electrode TCE or the sensing connecting electrode RCE (or in the Y-axis direction). That is, the driving electrodes TE1 and the sensing electrodes RE1 may be arranged in the order of a driving electrode TE1, a sensing electrode RE1, a driving electrode TE1, and a sensing electrode RE1 along the lengthwise direction of the driving connecting electrode TCE or the sensing connecting electrode RCE2 (or along the Y-axis direction).

The force sensing layer PSL is disposed on a surface of the second substrate SUB2 facing the first substrate SUB1.

The force sensing layer PSL may be disposed to overlap with the driving electrodes TE1 and the sensing electrodes RE1.

The force sensing layer PSL may include a pressure sensitive material and a polymer resin in which the pressure sensitive material is disposed. The pressure sensitive material may be fine- or nanoparticles of a metal such as Ni, Al, Ti, tin (Sn), or Cu. For example, the force sensing layer PSL may be a quantum tunneling composite (QTC) layer.

When no power is applied to the second substrate SUB2 in the height direction of the first force sensor 510 (or in the Z-axis direction), a gap is formed between the force sensing layer PSL and the driving electrodes TE1 and between the force sensing layer PSL and the sensing electrodes RE1, as illustrated in FIG. 11. That is, when no power is applied to the second substrate SUB2, the force sensing layer PSL is spaced apart from the driving electrodes TE1 and the sensing electrodes RE1.

When power is applied to the second substrate SUB2 in the height direction of the first force sensor 510 (or in the Z-axis direction), the force sensing layer PSL may be placed in contact with the driving electrodes TE1 and the sensing electrodes RE1. In this case, at least one of the driving electrodes TE1 and at least one of the sensing electrodes RE1 may be physically connected via the force sensing layer PSL, and the force sensing layer PSL may serve as an electrical resistor.

Figure 12:
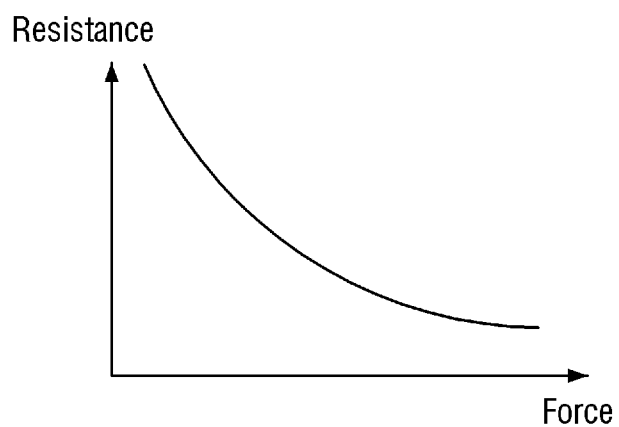
FIG. 12 is a graph showing variations in the resistance of sensing lines in accordance with the force of a force sensing layer.

According to the exemplary embodiment of FIGS. 10 and 11, the size of the contact area between the force sensing layer PSL and the driving electrodes TE1/the sensing electrodes RE1 may vary depending on the force applied to each of the first through eighth force sensing cells CE1, CE2, CE3, CE4, CE5, CE6, CE7, and CE8, and as a result, the resistance of the sensing line electrically connected to the sensing electrodes RE1 of the corresponding force sensing cell may vary. For example, referring to FIG. 12, the higher the force applied to each of the first through eighth force sensing cells CE1, CE2, CE3, CE4, CE5, CE6, CE7, and CE8 of the first force sensor 510, the lower the resistance of the sensing line connected to the sensing electrodes RE1 of the corresponding force sensing cell. Since the force sensing unit 330 can detect current or voltage variations from the first through eighth sensing lines RL1, RL2, RL3, RL4, RL5, RL6, RL7, and RL8 based on variations in the resistance of the first through eighth sensing lines RL1, RL2, RL3, RL4, RL5, RL6, RL7, and RL8 and can thus detect the force at which the user presses the display device 10 with his or her hand, the first force sensor 510 can be used as an input device for detecting input from the user.

The second force sensor 520 is substantially the same as the first force sensor 510 described above with reference to FIGS. 10 and 11, and thus, a detailed description thereof will be omitted.

Figure 13:
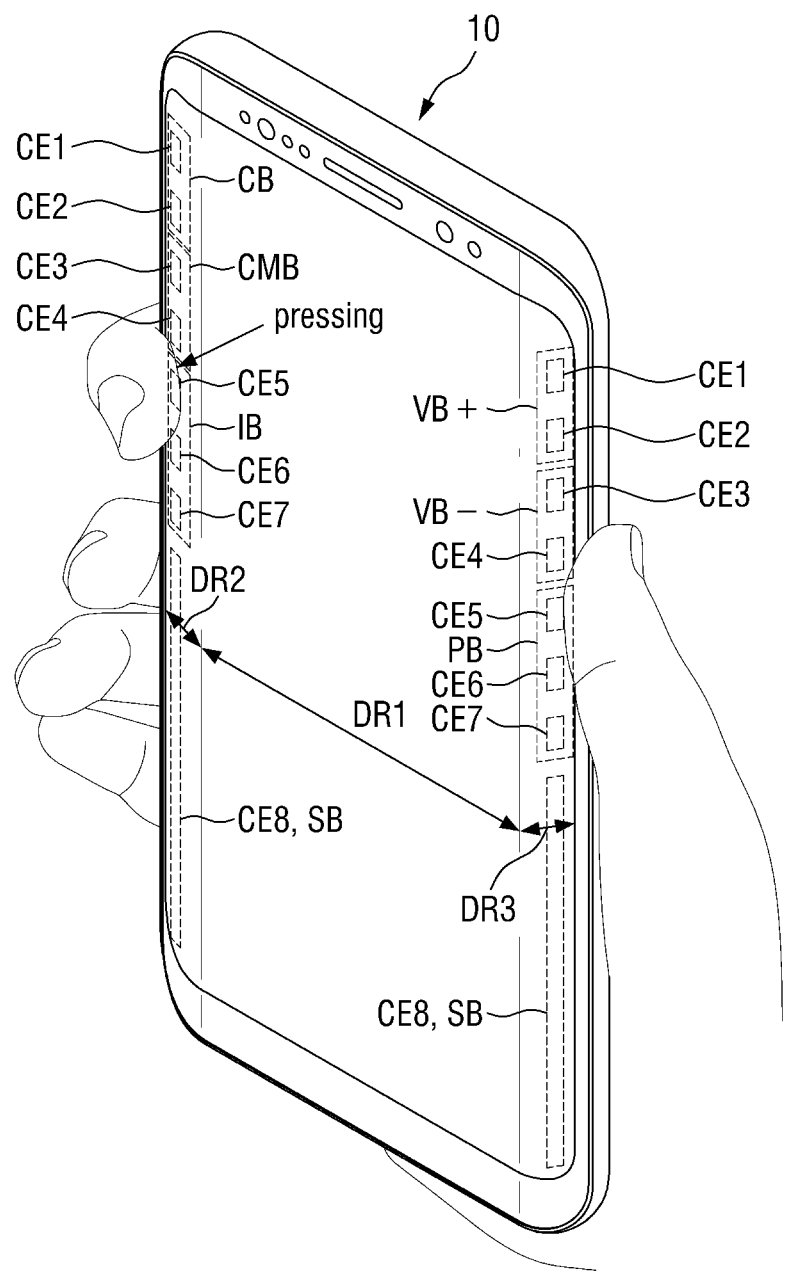
FIGS. 13 and 14 are perspective views illustrating exemplary concept of using the first and second force sensors of the display device constructed according to an exemplary embodiment as physical buttons.
Figure 14:
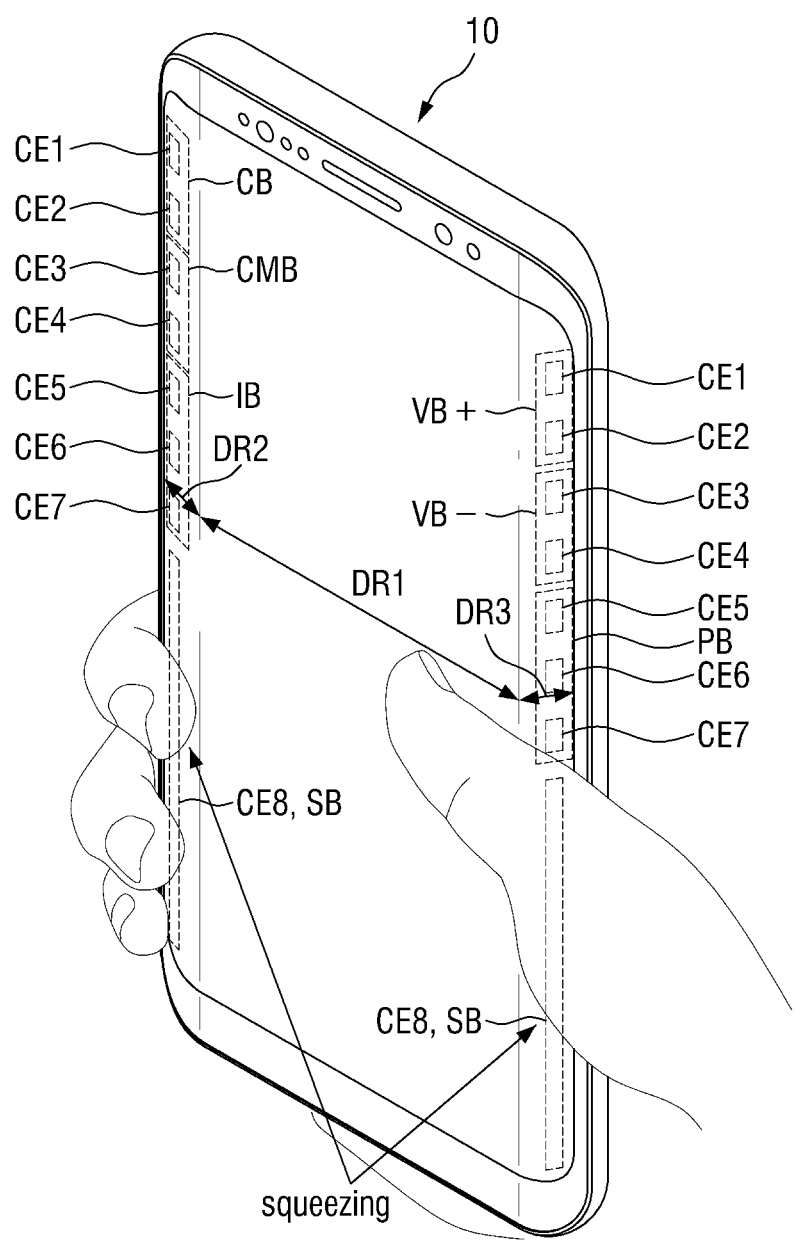

FIGS. 13 and 14 are perspective views illustrating exemplary concept of using the first and second force sensors of the display device as physical buttons.

Specifically, FIGS. 13 and 14 illustrate the first through eighth force sensing cells CE1, CE2, CE3, CE4, CE5, CE6, CE7, and CE8 of each of the first and second force sensors 510 or 520, which are disposed in the second and third areas DR2 and DR3 of the display device 10. A first vibration generating device 810 may be disposed adjacent to the first through fourth force sensing cells CE1, CE2, CE3, and CE4 of the first force sensor 510, which is disposed in a right curved portion of the display device 10, and a third vibration generating device 830 may be disposed adjacent to the fifth through eighth force sensing cells CE5, CE6, CE7, and CE8 of the first force sensor 510. Also, a second vibration generating device 820 may be disposed adjacent to the first through fourth force sensing cells CE1, CE2, CE3, and CE4 of the second force sensor 510, which is disposed in a left curved portion of the display device 10, and a fourth vibration generating device 840 may be disposed adjacent to the fifth through eighth force sensing cells CE5, CE6, CE7, and CE8 of the second force sensor 520.

FIG. 13 illustrates that while grabbing the display device 10 with the right hand, the user presses the fifth force sensing cell CE5 in the left curved portion of the display device 10, which corresponds to the second area DR2, with the index finger. FIG. 14 illustrates that while grabbing the display device 10 with the right hand, the user squeezes the eighth force sensing cell CE8 in the left curved portion of the display device 10 with the middle, ring, and little fingers and squeezes the eighth force sensing cell CE8 in the right curved portion of the display device 10, which corresponds to the third area DR3, with the palm.

Referring to FIGS. 13 and 14, the first and second force sensors 510 and 520 may be used as physical buttons. Specifically, in response to force being applied to the first through eighth force sensing cells CE1, CE2, CE3, CE4, CE5, CE6, CE7, and CE8 of the first force sensor 510, which is formed in the right curved portion of the display device 10, and to the first through eighth force sensing cells CE1, CE2, CE3, CE4, CE5, CE6, CE7, and CE8 of the second force sensor 510, which is formed in the left curved portion of the display device 10, predetermined applications or operations may be executed or performed accordingly.

For example, the first and second force sensing cells CE1 and CE2 formed in the right curved portion of the display device 10 may be used as a volume up button VB+ for raising the volume of the display device 10, the third and fourth force sensing cells CE3 and CE4 formed in the right curved portion of the display device 10 may be used as a volume down button VB− for lowering the volume of the display device 10, and the fifth, sixth, and seventh force sensing cells CE5, CE6, and CE7 formed in the right curved portion of the display device 10 may be used as a power button PWB for turning off the screen or the power of the display device 10.

In this example, in response to force being detected by the first and second force sensing cells CE1 and CE2 formed in the right curved portion of the display device 10, the main processor 710 may control the volume of the speaker of the display device 10 to increase. Also, in response to force being detected by the third and fourth force sensing cells CE3 and CE4 formed in the right curved portion of the display device 10, the main processor 710 may control the volume of the speaker of the display device 10 to decrease. Also, in response to force being detected by the fifth, sixth, and seventh force sensing cells CE5, CE6, and CE7 formed in the right curved portion of the display device 10, the main processor 710 may turn off the screen of the display device 10 or may output a screen for selecting to power off the display device 10.

For example, the first and second force sensing cells CE1 and CE2 formed in the left curved portion of the display device 10 may be used as a call button CB for executing a call application, the third and fourth force sensing cells CE3 and CE4 formed in the left curved portion of the display device 10 may be used as a camera button for executing a camera application, and the fifth, sixth, and seventh force sensing cells CE5, CE6, and CE7 formed in the left curved portion of the display device 10 may be used as an Internet button D3 for executing an Internet application.

In this example, in response to force being detected by the first and second force sensing cells CE1 and CE2 formed in the left curved portion of the display device 10, the main processor 710 may control the call application to be executed. Also, in response to force being detected by the third and fourth force sensing cells CE3 and CE4 formed in the left curved portion of the display device 10, the main processor 710 may control the camera application to be executed. Also, in response to force being detected by the fifth, sixth, and seventh force sensing cells CE5, CE6, and CE7 formed in the left curved portion of the display device 10, the main processor 710 may control the Internet application to be executed.

The exemplary embodiment of FIGS. 13 and 14 is merely exemplary, and thus, the present disclosure is not limited thereto. That is, various functions including or including those set forth herein may be performed in response to force being applied to the first through seventh force sensing cells CE1, CE2, CE3, CE4, CE5, CE6, and CE7 of the first force sensor 510, which is disposed in the right curved portion of the display device 10, and the first through seventh force sensing cells CE1, CE2, CE3, CE4, CE5, CE6, and CE7 of the second force sensor 520, which is disposed in the left curved portion of the display device 10. Also, the first through seventh force sensing cells CE1, CE2, CE3, CE4, CE5, CE6, and CE7 of the first force sensor 510, which is disposed in the right curved portion of the display device 10, and the first through seventh force sensing cells CE1, CE2, CE3, CE4, CE5, CE6, and CE7 of the second force sensor 520, which is disposed in the left curved portion of the display device 10, may be programmed to cause different operations to be performed.

The eighth force sensing cells CE8 formed in the left and right curved portions of the display device 10 may be used as squeeze sensing buttons SB. Squeezing force applied to the eighth force sensing cell CE8 of each of the first and second force sensors 510 and 520 may be greater than force applied to the first through seventh force sensing cells CE1, CE2, CE3, CE4, CE5, CE6, and CE7 of each of the first and second force sensors 510 and 520. In response to squeezing force being detected by the eighth force sensing cells CE8 formed in the left and right curved portions of the display device 10, the main processor 710 may control a predetermined application or operation to be executed or performed. For example, in response to squeezing force being detected by the eighth force sensing cells CE8 formed in the left and right curved portions of the display device 10, the main processor 710 may control the display device 10 to be turned on from a sleep mode.

According to the exemplary embodiment of FIGS. 13 and 14, the first and second force sensors 510 and 520 are disposed in the second and third areas DR2 and DR3, which correspond to the curved portions of the display device 10, and can thus be used as physical buttons such as volume control buttons, a power button, a call button, a camera button, an Internet button, and a squeeze sensing button.

In addition, in response to force being applied to the first and second force sensors 510 and 520, the vibration generating device 901 may be controlled to vibrate. In this case, the pattern of vibration generated by the vibration generating device 901 in response to force being applied to the first force sensor 510 may differ from the pattern of vibration generated by the vibration generating device 901 in response to force being applied to the second force sensor 520. Also, the pattern of vibration generated by the vibration generating device 901 may vary depending on to which of the first through eighth force sensing cells CE1, CE2, CE3, CE4, CE5, CE6, CE7, and CE8 of each of the first and second force sensors 510 and 520 force is applied. The pattern of vibration generated by the vibration generating device 901 may be controlled by controlling the vibration frequency, vibration amplitude, and/or vibration duration of the vibration generating device 901.

According to the exemplary embodiment of FIGS. 13 and 14, in response to force being detected by the first through eighth force sensing cells CE1, CE2, CE3, CE4, CE5, CE6, CE7, and CE8 of each of the first and second force sensors 510 and 520, the vibration generating device 901 can vibrate and can thus provide various haptic feedback to the user.

Figure 15:
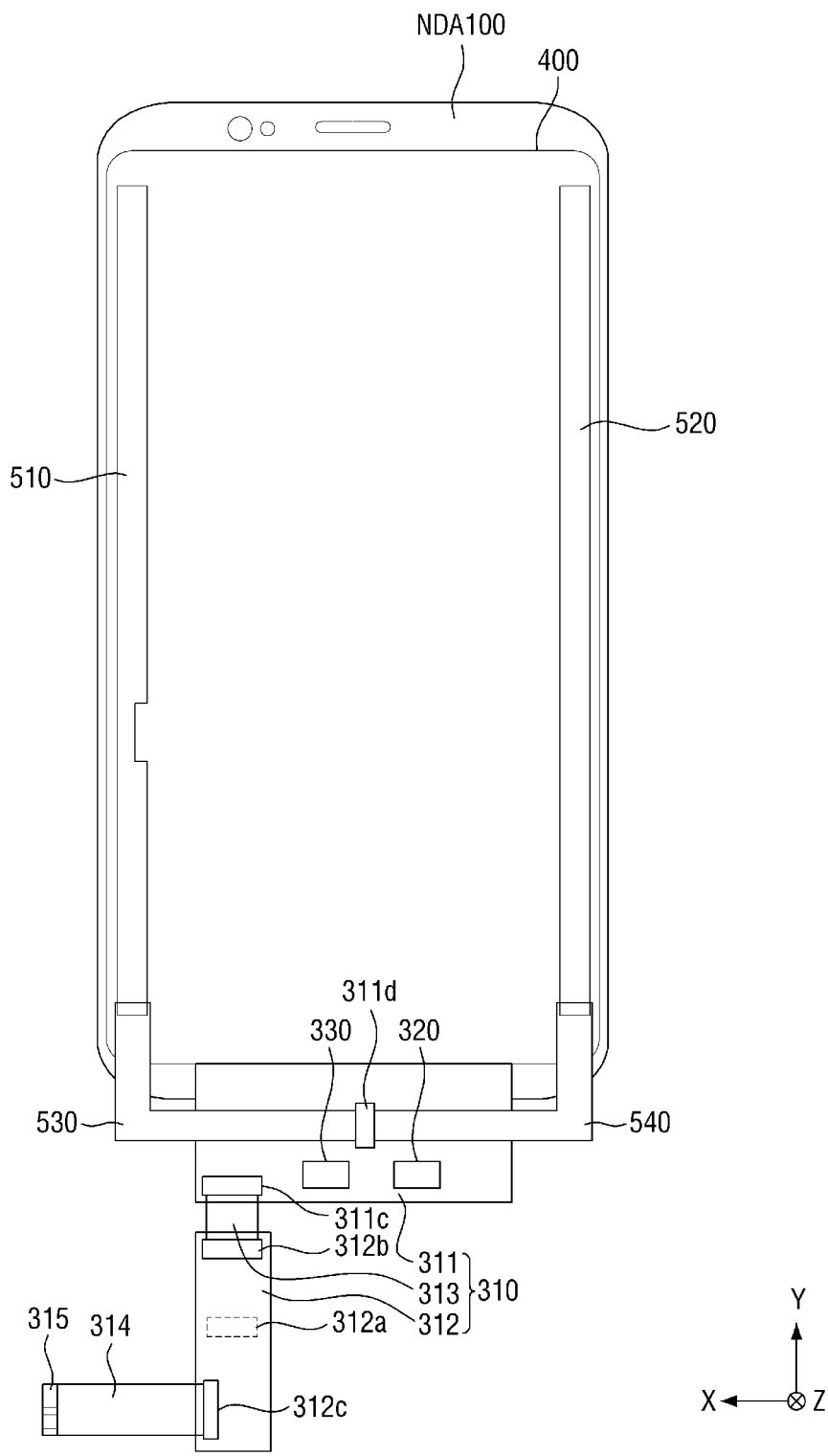
FIG. 15 is a bottom view illustrating another exemplary embodiment of the display panel attached to the cover window before bending the display circuit board, the first flexible circuit board, and the second flexible circuit board of FIG. 2 downwardly.
Figure 16:
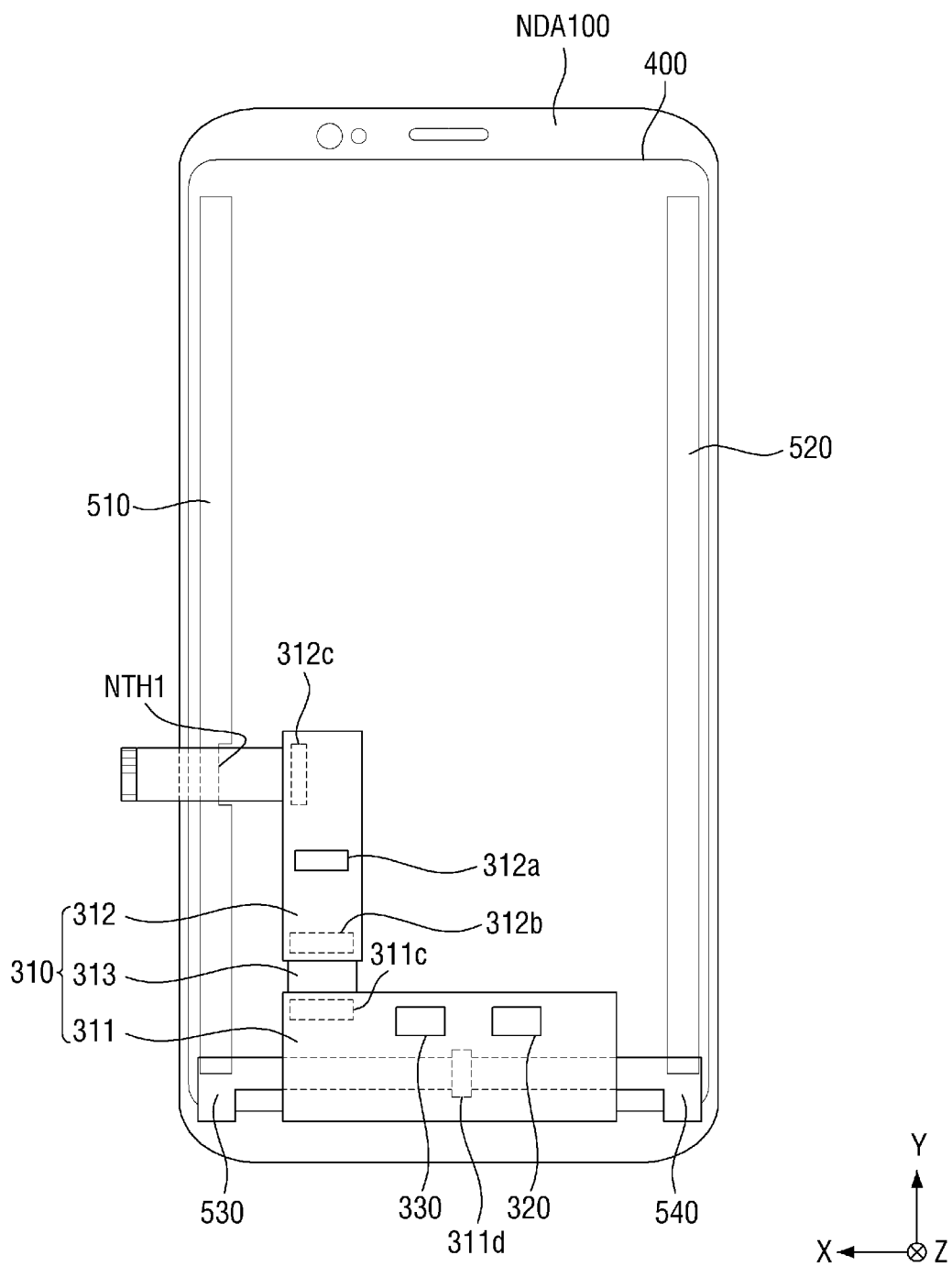
FIG. 16 is a bottom view illustrating another exemplary embodiment of the display panel attached to the cover window after bending the display circuit board, the first flexible circuit board, and the second flexible circuit board of FIG. 2 downwardly.

FIG. 15 is a bottom view illustrating another exemplary embodiment of the display panel 300 attached to the cover window 100 before bending the display circuit board 310, the first flexible circuit board 530, and the second flexible circuit board 540 of FIG. 2 downwardly. FIG. 16 is a bottom view illustrating another exemplary embodiment of the display panel 300 attached to the cover window 100 after bending the display circuit board 310, the first flexible circuit board 530, and the second flexible circuit board 540 of FIG. 2 downwardly.

The exemplary embodiment of FIGS. 15 and 16 differs from the exemplary embodiment of FIGS. 3 and 4 in that a display circuit board 310 includes a single connector connected to both the first and second flexible circuit boards 530 and 540, i.e., a fourth connector 311$d$. The exemplary embodiment of FIGS. 15 and 16 will hereinafter be described focusing mainly on the difference with the exemplary embodiment of FIGS. 3 and 4.

Referring to FIGS. 15 and 16, the display circuit board 310 may include the fourth connector 311$d$, and the fourth connector 311$d$ may include a plurality of connector receiving portions into which a plurality of connector connecting portions can be inserted. A first connector receiving portion of the fourth connector 311$d$ may be disposed to face the first flexible circuit board 530 and may be connected to the connector connecting portion provided at the first end of the first flexible circuit board 530, which is connected to the first force sensor 510. A second connector receiving portion of the fourth connector 311$d$ may be disposed to face the second flexible circuit board 540 and may be connected to the connector connecting portion provided at one end of the second flexible circuit board 540, which is connected to the second force sensor 520. Accordingly, the first force sensor 510 can be electrically connected to the force sensing unit 330, and the second force sensor 520 can be electrically connected to the force sensing unit 330.

According to the exemplary embodiment of FIGS. 15 and 16, the first force sensor 510 can be connected to the display circuit board 310 via the first flexible circuit board 530, and the second force sensor 520 can be connected to the display circuit board 310 via the second flexible circuit board 540. Accordingly, the first and second force sensors 510 and 520 can be electrically connected stably to the force sensing unit 330 of the display circuit board 310.

Figure 17:
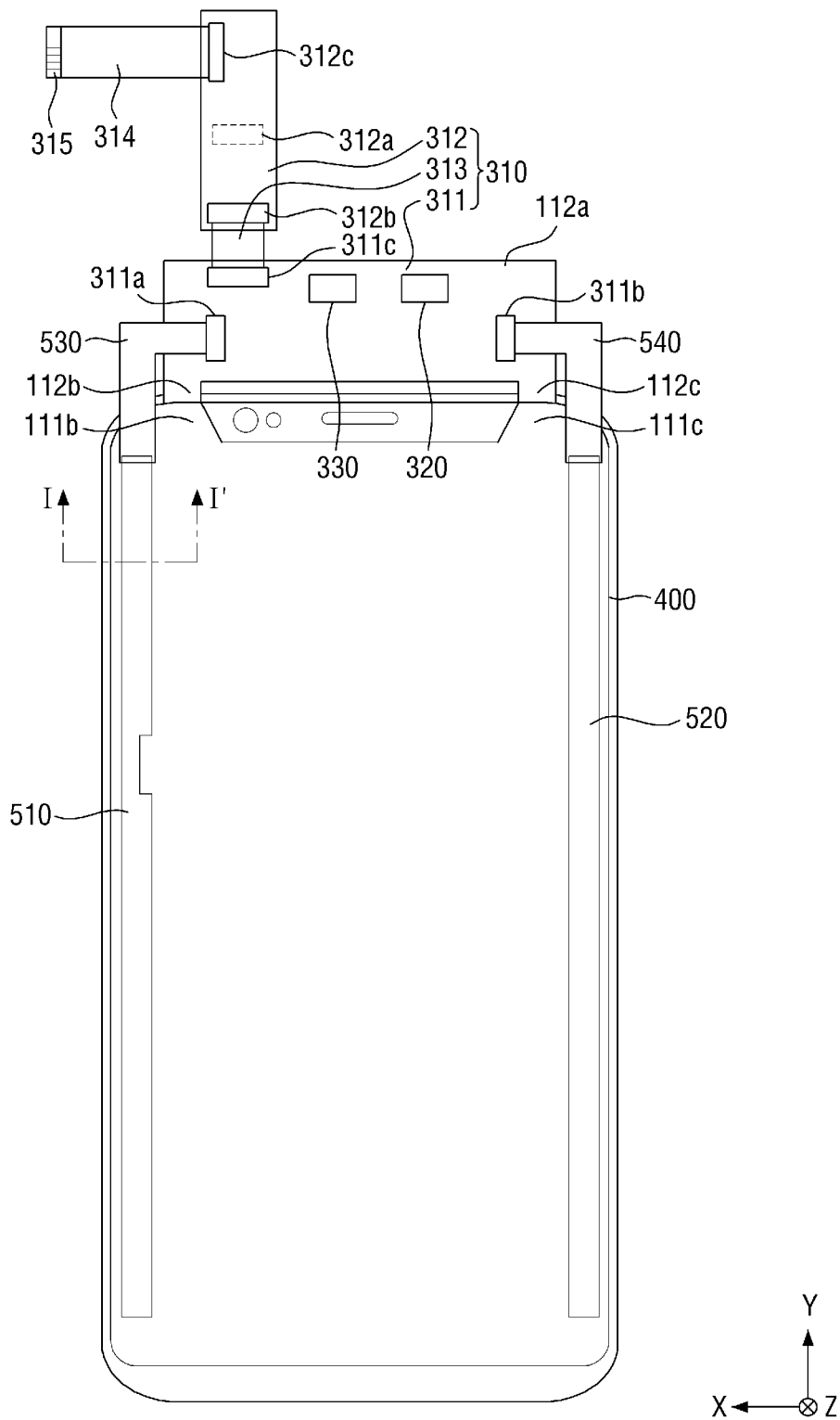
FIG. 17 is a bottom view illustrating another exemplary embodiment of the display panel attached to the cover window before bending the display circuit board, the first flexible circuit board, and the second flexible circuit board of FIG. 2 downwardly.
Figure 18:
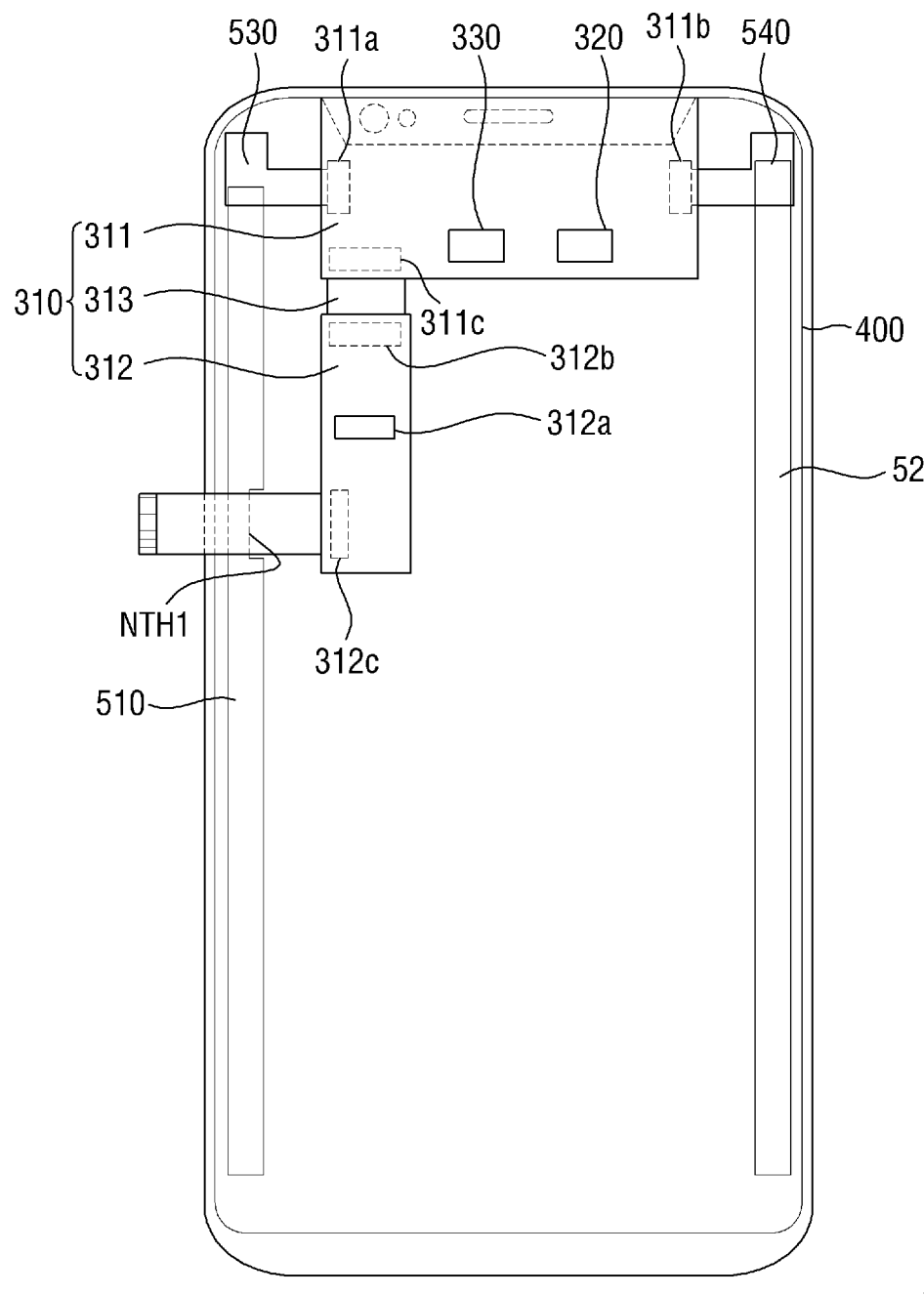
FIG. 18 is a bottom view illustrating another exemplary embodiment of the display panel attached to the cover window after bending the display circuit board, the first flexible circuit board, and the second flexible circuit board of FIG. 2 downwardly.
Figure 19:
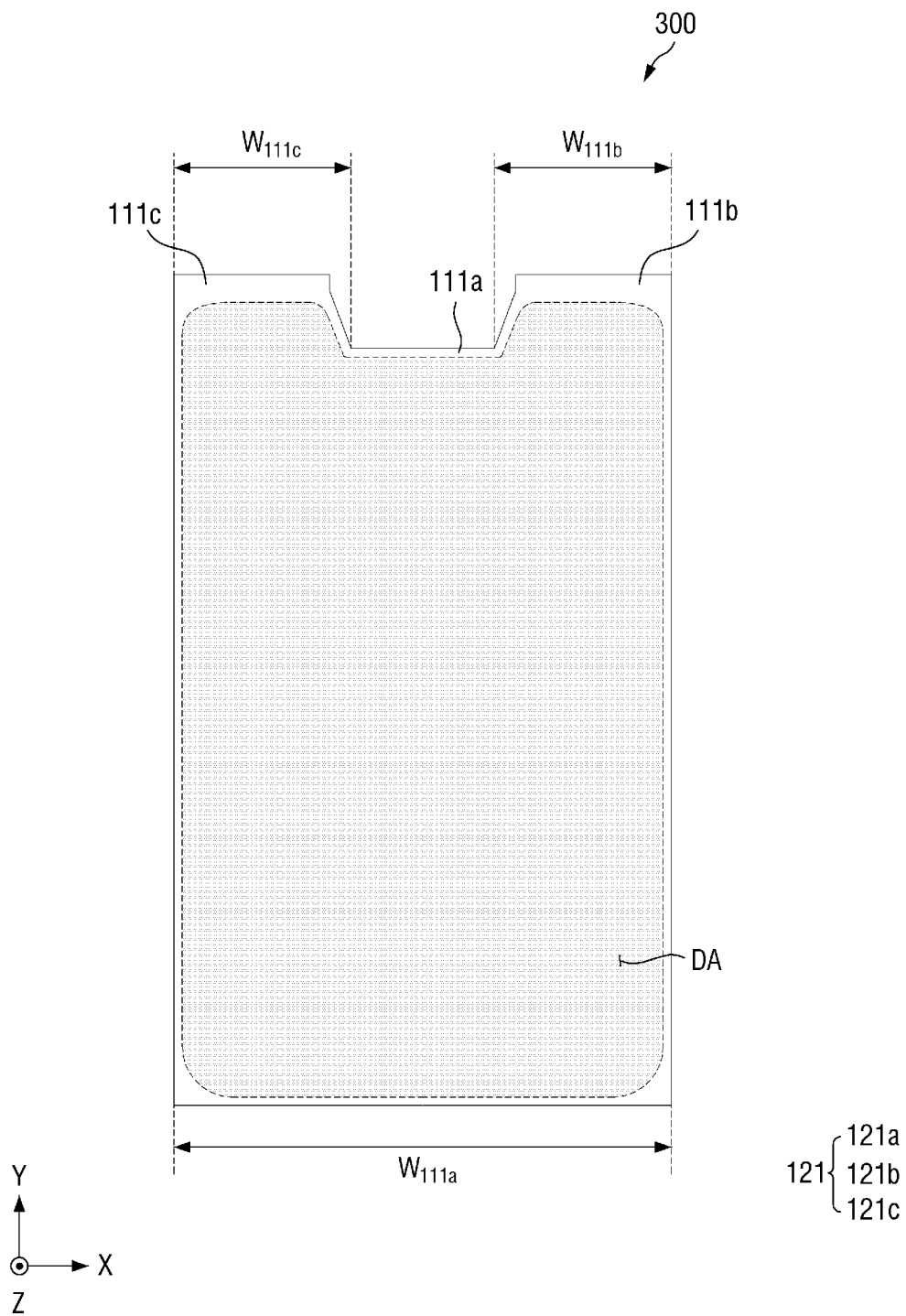
FIG. 19 is a plan view illustrating the display panel of FIGS. 17 and 18.

FIG. 17 is a bottom view illustrating another exemplary embodiment of the display panel 300 attached to the cover window 100 before bending the display circuit board 310, the first flexible circuit board 530, and the second flexible circuit board 540 of FIG. 2 downwardly. FIG. 18 is a bottom view illustrating another exemplary embodiment of the display panel 300 attached to the cover window 100 after bending the display circuit board 310, the first flexible circuit board 530, and the second flexible circuit board 540 of FIG. 2 downwardly. FIG. 19 is a plan view illustrating the display panel 300 of FIGS. 17 and 18.

The exemplary embodiment of FIGS. 17, 18, and 19 differs from the exemplary embodiment of FIGS. 3 and 4 in that a first side of a display panel 300 is partially recessed in a plan view, and that a display circuit board 310 is attached to protruding portions 111b and 111c on the first side of the display panel 300. The exemplary embodiment of FIGS. 17, 18, and 19 will hereinafter be described focusing mainly on the differences with the exemplary embodiment of FIGS. 3 and 4.

Referring to FIGS. 17 and 18, the first side of the display panel 300 may be partially recessed in a plan view. Specifically, the first side of the display panel 300 may be recessed in the shape of a bay, a notch, or a trench in a plan view. Accordingly, the first and second protruding portions 111b and 111c may be formed on the first side of the display panel 300.

Specifically, referring to FIG. 19, the display panel 300 may include a first main portion 111a having a first maximum width W111a in the first direction, the first protruding portion 111b protruding from the first main portion 111a in the second direction, and the second protruding portion 111c protruding from the first main portion 111a in the second direction and spaced apart from the first protruding portion 111b in the first direction. The first protruding portion 111b of the display panel 300 may have a second maximum width W111b in the first direction, and the second protruding portion 111c may have a third maximum width W111c in the first direction. The second and third maximum widths W111b and W111c may be smaller than the first maximum width W111a. For example, the sum of the second and third maximum widths W111b and W111c may be smaller than the first maximum width W111a. The second and third maximum widths W111b and W111c may be the same or may be different. The display panel 300 may have a rectangular shape with right-angled or round corners, and the maximum length, in the second direction, of the display panel 300 may be greater than the length, in the first direction, of the display panel 300, i.e., the first maximum width W1a.

The display area DA of the display panel 300 refers to an area in which an image is displayed by pixels. The display area DA of the display panel 300 may be formed not only in the first main portion 111a, but also in parts of the first and second protruding portions 111b and 111c. Accordingly, an image can be displayed not only in the main portion 111a, but also in parts of the first and second protruding portions 111b and 111c.

A first side of the display circuit board 310 may be recessed in the shape of a bay, a notch, or a trench in a plan view. The first side of the display circuit board 310 refers to the side of the display circuit board 310 that is opposite to the first side of the display panel 300. Accordingly, the display circuit board 310 may be attached to the first and second protruding portions 111b and 111c formed on the first side of the display panel 300.

Specifically, the display circuit board 310 may include a second main portion 112a having a first maximum width in the first direction and third and fourth protruding portions 112b and 112c protruding from the second main portion 112a in the second direction. The third protruding portion 112b of the display circuit board 310 may correspond to the first protruding portion 111b of the display panel 300, and the fourth protruding portion 112c may correspond to the second protruding portion 111c of the display panel 300.

The display circuit board 310 may be disposed on the first and second protruding portions 111b and 111c. For example, the third protruding portion 112b of the display circuit board 310 may be attached to the top surface of the first protruding portion 111b of the display panel 300, and the fourth protruding portion 112c may be attached to the top surface of the second protruding portion 111c of the display panel 300.

In the first main portion 111a of the display circuit board 310, the display driving unit 320, the force sensing unit 330, the first connector 311a, the second connector 311b, and the third connector 311c may be provided.

The first end of the first flexible circuit board 530 may be connected to the first connector 311a, which is provided in the second main portion 112a of the display circuit board 310. To this end, a connector connecting portion may be provided at the first end of the first flexible circuit board 530. The second end of the first flexible circuit board 530 may be connected to the pad unit PAD provided at the first force sensor 510. The second end of the first flexible circuit board 530 may be attached on the pad unit PAD of the first force sensor 510.

Specifically, the first force sensor 510 may have a rectangular shape having short sides extending in the first direction (or the X-axis direction) and long sides extending in the second direction (or the Y-axis direction), in which case, the pad unit PAD of the first force sensor 510 may be disposed at one end, in the second direction (or the Y-axis direction), of the first force sensor 510. For example, the pad unit PAD of the first force sensor 510 may be disposed at an upper end, in the second direction (or the Y-axis direction), of the first force sensor 510.

The first flexible circuit board 530 may be connected to the first connector 311a of the display circuit board 310 when the display circuit board 310 is unfolded, as illustrated in FIG. 17, instead of being bent over the bottom of the display panel 300. Accordingly, the first flexible circuit board 530 may have a curved shape such as an L shape. That is, the first flexible circuit board 530 may be formed to extend from the end of the first force sensor 510 along the second direction (or the Y-axis direction) and to be bent over the display circuit board 310 along the first direction (or the X-axis direction).

The second flexible circuit board 540 electrically connects the second force sensor 520 and the display circuit board 310. The first end of the second flexible circuit board 540 may be connected to the second connector 311b of the display circuit board 310. To this end, a connector connecting portion may be provided at the first end of the second flexible circuit board 540. The second end of the second flexible circuit board 540 may be connected to the pad unit provided at the second force sensor 520. The second end of the second flexible circuit board 540 may be attached on the pad unit of the second force sensor 520.

Specifically, the second force sensor 520 may have a rectangular shape having short sides extending in the first direction (or the X-axis direction) and long sides extending in the second direction (or the Y-axis direction), in which case, the pad unit of the second force sensor 520 may be disposed at one end, in the second direction (or the Y-axis direction), of the second force sensor 520. For example, the pad unit of the second force sensor 520 may be disposed at an upper end, in the second direction (or the Y-axis direction), of the second force sensor 520.

The second flexible circuit board 540 may be connected to the second connector 311b of the display circuit board 310 when the display circuit board 310 is unfolded, as illustrated in FIG. 17, instead of being bent over the bottom of the display panel 300. Accordingly, the second flexible circuit board 540 may have a curved shape such as an L shape. That is, the second flexible circuit board 540 may be formed to extend from the end of the second force sensor 520 along the second direction (or the Y-axis direction) and to be bent over the display circuit board 310 along the direction opposite to the first direction (or the X-axis direction).

The display circuit board 310, the first flexible circuit board 530, and the second flexible circuit board 540 may be bent at least once, as illustrated in FIG. 18. Specifically, after the first and second flexible circuit boards 530 and 540 are connected to the first and second connectors 311a and 311b, respectively, of the display circuit board 310, the display circuit board 310, the first flexible circuit board 530, and the second flexible circuit board 540 may be bent over the bottom of the display panel 300, particularly, over the bottom of the panel bottom member 400, as illustrated in FIG. 18, and may then be fixed.

In this case, the first end of the first flexible circuit board 530 is attached to the pad unit PAD of the first force sensor 510, but the second end of the first flexible circuit board 530 may be disposed below the panel bottom member 400 because the first flexible circuit board 530 is bent over the bottom of the panel bottom member 400. Similarly, the first end of the second flexible circuit board 540 is attached to the pad unit of the second force sensor 520, but the second end of the second flexible circuit board 540 may be disposed below the panel bottom member 400 because the second flexible circuit board 540 is bent over the bottom of the panel bottom member 400. Similarly, one side of the display circuit board 310 may be attached on the top surface or the bottom surface of the display panel 300, but the other side of the display circuit board 310 may be disposed below the panel bottom member 400 because the display circuit board 310 is bent over the panel bottom member 400.

According to the exemplary embodiment of FIGS. 17 and 18, the first force sensor 510 can be connected to the display circuit board 310 via the first flexible circuit board 530, and the second force sensor 520 can be connected to the display circuit board 310 via the second flexible circuit board 540. Accordingly, the first and second force sensors 510 and 520 can be electrically connected stably to the force sensing unit 330 of the display circuit board 310.

Figure 20:
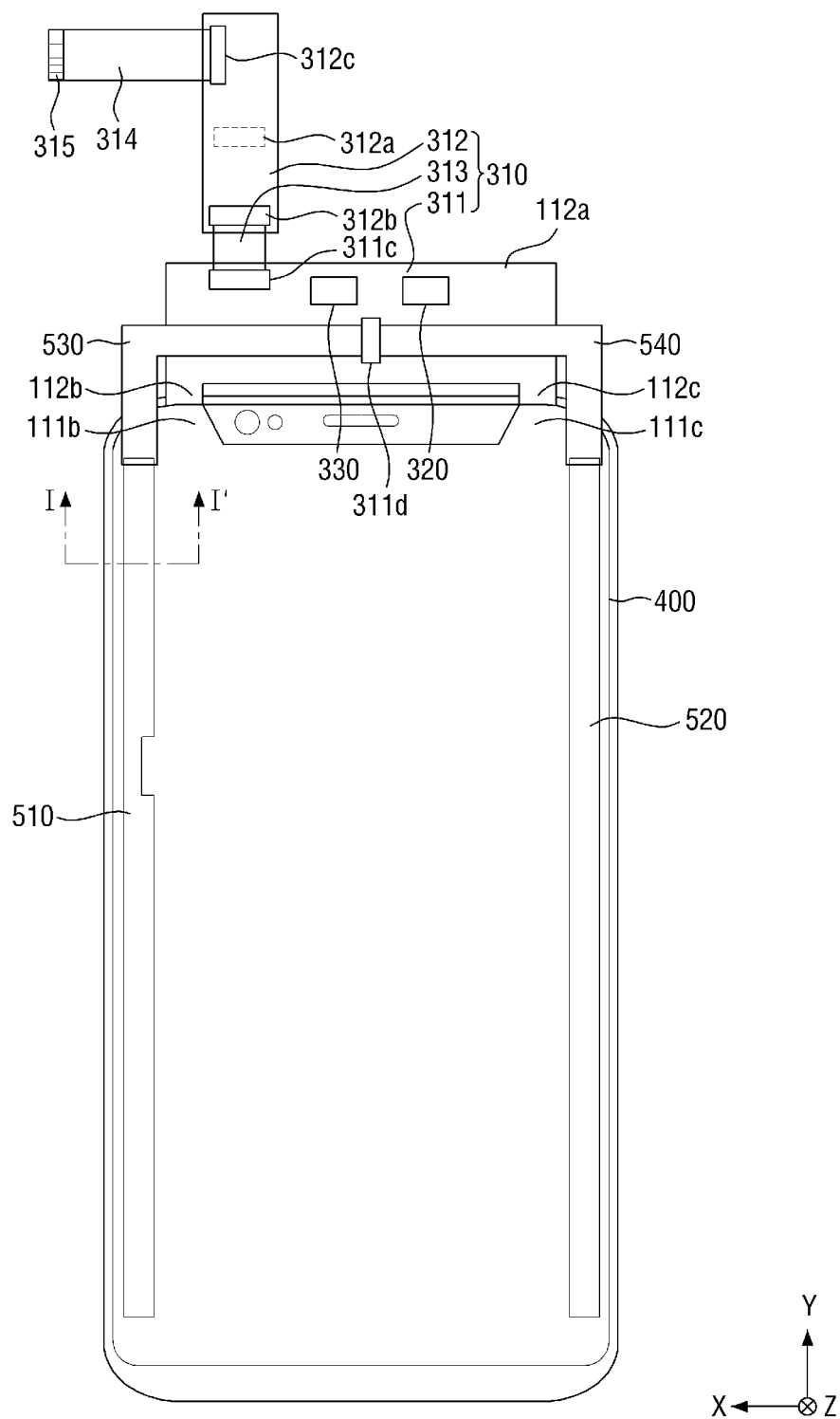
FIG. 20 is a bottom view illustrating another exemplary embodiment of the display panel attached to the cover window before bending the display circuit board, the first flexible circuit board, and the second flexible circuit board of FIG. 2 downwardly.
Figure 21:
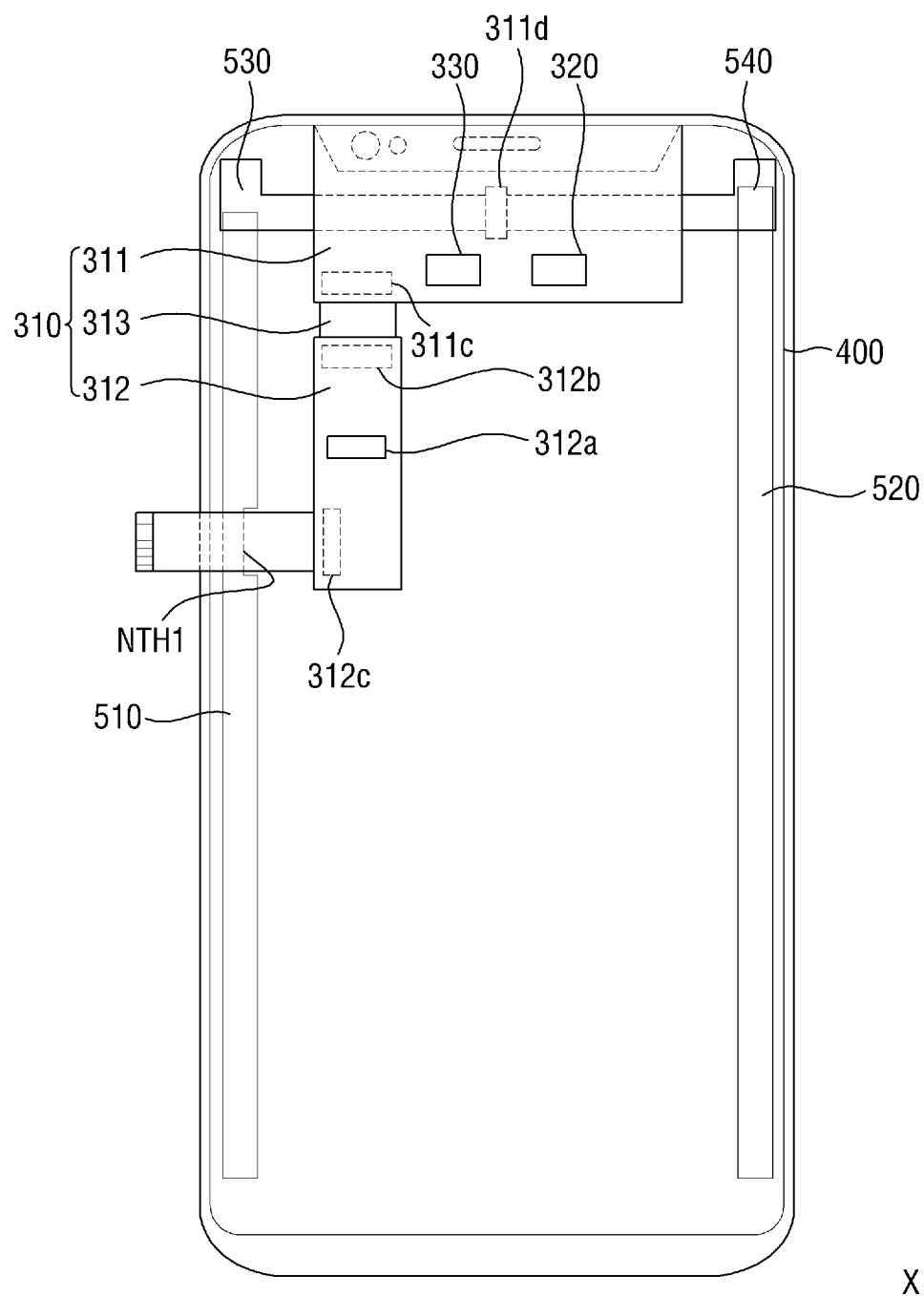
FIG. 21 is a bottom view illustrating another exemplary embodiment of the display panel attached to the cover window after bending the display circuit board, the first flexible circuit board, and the second flexible circuit board of FIG. 2 downwardly.

FIG. 20 is a bottom view illustrating another exemplary embodiment of the display panel 300 attached to the cover window 100 before bending the display circuit board 310, the first flexible circuit board 530, and the second flexible circuit board 540 of FIG. 2 downwardly. FIG. 21 is a bottom view illustrating another exemplary embodiment of the display panel 300 attached to the cover window 100 after bending the display circuit board 310, the first flexible circuit board 530, and the second flexible circuit board 540 of FIG. 2 downwardly.

The exemplary embodiment of FIGS. 20 and 21 differs from the exemplary embodiment of FIGS. 17 and 18 in that a display circuit board 310 includes a single connector connected to both the first and second flexible circuit boards 530 and 540, i.e., a fourth connector 311d. The exemplary embodiment of FIGS. 20 and 21 will hereinafter be described focusing mainly on the difference with the exemplary embodiment of FIGS. 17 and 18.

Referring to FIGS. 20 and 21, the display circuit board 310 may include the fourth connector 311d, and the fourth connector 311d may include a plurality of connector receiving portions into which a plurality of connector connecting portions can be inserted. The fourth connector 311d may be provided in a second main portion 112a of the display circuit board 310. A first connector receiving portion of the fourth connector 311d may be disposed to face the first flexible circuit board 530 and may be connected to the connector connecting portion provided at the first end of the first flexible circuit board 530, which is connected to the first force sensor 510. A second connector receiving portion of the fourth connector 311d may be disposed to face the second flexible circuit board 540 and may be connected to the connector connecting portion provided at one end of the second flexible circuit board 540, which is connected to the second force sensor 520. Accordingly, the first force sensor 510 can be electrically connected to the force sensing unit 330, and the second force sensor 520 can be electrically connected to the force sensing unit 330.

According to the exemplary embodiment of FIGS. 20 and 21, the first force sensor 510 can be connected to the display circuit board 310 via the first flexible circuit board 530, and the second force sensor 520 can be connected to the display circuit board 310 via the second flexible circuit board 540. Accordingly, the first and second force sensors 510 and 520 can be electrically connected stably to the force sensing unit 330 of the display circuit board 310.

FIG. 22 is a flowchart illustrating a method of manufacturing a display device constructed according to an exemplary embodiment of the present disclosure. FIGS. 23A, 23B, 23C, 23D, and 23E are perspective views illustrating the method of manufacturing a display device constructed according to an exemplary embodiment of the present disclosure.

Referring to FIGS. 22 and 23A, a first heat dissipation sheet 410 is attached to the bottom surface of a display panel 300 (S101).

The first heat dissipation sheet 410 may include graphite or carbon nanotubes. The first heat dissipation sheet 410 may be attached to the bottom surface of the display panel 300 through a lamination process using a roller R.

Specifically, as illustrated in FIG. 23A, the display panel 300 includes a first area DR1, which corresponds to a flat portion, a second area DR2, which extends from one side of the first area DR1 and corresponds to a first curved portion, and a third area DR3, which extends from the other side of the first area DR1 and corresponds to a second curved portion. In a case where lamination using the roller R is performed on the second and third areas DR2 and DR3 of the display panel 300, the second and third areas DR2 and DR3 of the display panel 300 may be damaged. Thus, the roller R may be placed on the bottom surface of the first heat dissipation sheet 410 in the first area DR1 of the display panel 300, and then, the first heat dissipation sheet 410 may be pressurized with the roller R.

A light-absorbing member may be attached to the bottom surface of the display panel 300, and a buffer member may be attached on the light-absorbing member. In this case, the first heat dissipation sheet 410 may be attached on the buffer member. The light-absorbing member may include a light-absorbing material such as a black pigment or dye. The buffer member may be disposed below the light-absorbing member. The buffer member absorbs external shock and can thus prevent or reduce the display panel 300 from being damaged. The buffer member may be formed of a polymer resin such as polyurethane, polycarbonate, polypropylene, or polyethylene or may include an elastic material such as a sponge obtained by foam-molding rubber, a urethane-based material or an acrylic material. The buffer member may be a cushion layer. The first heat dissipation sheet 410 may include graphite or carbon nanotubes.

Thereafter, referring to FIGS. 22 and 23B, first and second force sensors 510 and 520 are attached to the bottom surface of a second heat dissipation sheet 420 (S102).

Specifically, the first force sensor 510 may be attached to a first edge of the second heat dissipation sheet 420, and the second force sensor 520 may be attached to a second edge of the second heat dissipation sheet 420 that is opposite to the first edge of the second heat dissipation sheet 420. The first and second force sensors 510 and 520 may be attached to the bottom surface of the second heat dissipation sheet 420 via adhesive members. The adhesive members may be PSAs.

Each of the first and second force sensors 510 and 520 may have a rectangular shape having short sides extending in a first direction (or an X-axis direction) and long sides extending in a second direction (or a Y-axis direction). In this case, pad units of the first and second force sensors 510 and 520 may be disposed at ends, in the second direction (or the Y-axis direction), of the first and second force sensors 510 and 520. A first flexible circuit board 530 may be attached to the pad unit of the first force sensor 510, and a second flexible circuit board 540 may be attached to the pad unit of the second force sensor 520.

Thereafter, referring to FIGS. 22 and 23C, the second heat dissipation sheet 420 is attached to the bottom surface of the first heat dissipation sheet 410, which is disposed below the display panel 300 (S103).

The second heat dissipation sheet 420 can block electromagnetic waves and may be formed as a thin film of a metal having excellent thermal conductivity such as Cu, Ni, ferrite, or Ag. The second heat dissipation sheet 420 may be attached to the bottom surface of the display panel 300 through lamination using the roller R.

Specifically, as illustrated in FIG. 23A, the display panel 300 includes the first area DR1, which corresponds to a flat portion, the second area DR2, which extends from one side of the first area DR1 and corresponds to a first curved portion, and the third area DR3, which extends from the other side of the first area DR1 and corresponds to a second curved portion. Since the first force sensor 510 is disposed on one side of the second heat dissipation sheet 420, the first force sensor 510 may be disposed in the second area DR2 of the display panel 300. Also, since the second force sensor 520 is disposed on the other side of the second heat dissipation sheet 420, the second force sensor 520 may be disposed in the third area DR2 of the display panel 300. In a case where lamination using the roller R is performed on the second and third areas DR2 and DR3 of the display panel 300, not only the second and third areas DR2 and DR3 of the display panel 300, but also the first and second force sensors 510 and 520, which are attached to the bottom surface of the second heat dissipation sheet 420, may be damaged. Thus, the roller R may be placed on the bottom surface of the second heat dissipation sheet 420 in the first area DR1 of the display panel 300, and then, the second heat dissipation sheet 420 may be pressurized with the roller R.

The first flexible circuit board 530 may be attached to the pad unit of the first force sensor 510, which is disposed at one end of the first force sensor 510, and the second flexible circuit board 530 may be attached to the pad unit of the second force sensor 520, which is disposed at one end of the second force sensor 520. The first flexible circuit board 530 may be formed to extend from one end of the first force sensor 510 along the second direction (or the Y-axis direction) and to be bent over the display circuit board 310 along the first direction (or the X-axis direction). The second flexible circuit board 540 may be formed to extend from one end of the second force sensor 520 along the second direction (or the Y-axis direction) and to be bent over the display circuit board 310 along the direction opposite to the first direction (or the X-axis direction). As a result, the first and second flexible circuit boards 530 and 540 are not disposed in the first area DR1, which corresponds to the flat portion of the display panel 300, when lamination using the roller R is performed. Accordingly, the first and second flexible circuit boards 530 and 540 can be prevented or reduced from being damaged by, or interfering with, lamination.

In the exemplary embodiment of FIG. 22, since the first and second force sensors 510 and 520 are attached to the bottom surface of the second heat dissipation sheet 420 and then the second heat dissipation sheet 420 is attached to the bottom surface of the display panel 300, the precision of the alignment of the first and second force sensors 510 and 520 can be improved as compared to a case where the second heat dissipation sheet 420 is attached to the bottom surface of the display panel 300 and then the first and second force sensors 510 and 520 are attached to the second heat dissipation sheet 420.

The second heat dissipation sheet 420 is illustrated in FIGS. 22, 23A, 23B, and 23C as being attached to the bottom surface of the first heat dissipation sheet 410 at the bottom of the display panel 300, but the present disclosure is not limited thereto. The first heat dissipation sheet 410 may not be provided, in which case, the second heat dissipation sheet 420 may be attached directly to the bottom surface of the display panel 300. Also, the second heat dissipation sheet 420 may be attached to the bottom surface of the light-absorbing member or the buffer member on the bottom surface of the display panel 300.

Thereafter, referring to FIGS. 22 and 23D, the first and second flexible circuit boards 530 and 540 are connected to the display circuit board 310 (S104).

Specifically, a connector connecting portion provided at one end of the first flexible circuit board 530 is connected to a first connector 311a of the display circuit board 310, and a connector connecting portion provided at one end of the second flexible circuit board 540 is connected to a second connector 311b of the display circuit board 310.

Thereafter, referring to FIGS. 22 and 23E, the display circuit board 310, the first flexible circuit board 530, and the second flexible circuit board 540 are bent over the bottom of the display panel 300, particularly, the bottom of a panel bottom member 400 (S105).

The display circuit board 310 bent over the bottom of the display panel 300 may be fixed to fixing holes FH, which are formed in a frame 600, by fixing members.

According to the aforementioned and other exemplary embodiments of the present disclosure, each force sensing cell of a force sensor may have different resistance according to different contact area between a force sensing layer and driving electrodes/sensing electrodes depending on force applied to the force sensor, and the resistance of a sensing line electrically connected to the sensing electrodes may be different. Accordingly, force or pressure from a hand of a user can be detected by sensing current or voltage variations from sensing lines, and as a result, the force sensor can be used as an input device.

Also, a first force sensor can be connected to a display circuit board via a first flexible circuit board and a second force sensor can be connected to the display circuit board via a second flexible circuit board, and therefore, the first and second force sensors can be electrically connected stably to a force sensing unit of the display circuit board.

Also, a force sensor is attached to a bottom surface of a heat dissipation sheet and the heat dissipation sheet is attached to the bottom surface of a display panel, the precision of the alignment of the force sensor can be improved compared to a conventional case where the heat dissipation sheet is attached to the bottom surface of the display panel and then the force sensor is attached to the heat dissipation sheet.

Also, first and second flexible circuit boards are not placed in a first area of a display panel, which corresponds to a flat portion of the display panel, and therefore, when performing lamination using a roller, the first and second flexible circuit boards can be prevented or reduced from being damaged by, or interfering with, lamination.

Also, a waterproof member is disposed adjacent to first and second force sensors, the penetration of moisture or dust through the gap between a display panel and a frame can be prevented or reduced by the waterproof member. That is, a display device that is waterproof and dustproof can be provided.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel to display an image in a first direction, the display panel comprising a flat portion and a curved portion;
a first force sensor disposed below the curved portion of the display panel in a second direction opposite to the first direction;
a display circuit board attached to a first side of the display panel; and
a first flexible circuit board connecting the first force sensor and the display circuit board, wherein:
the display circuit board is bent a least once, and
the first flexible circuit board is bent at least once such that at least two portions of the first flexible circuit board face each other in the first direction and overlap the curved portion of the display panel in the first direction.

2. The display device of claim 1, further comprising:
a panel bottom member disposed below the display panel.

3. The display device of claim 2, wherein the first force sensor is attached to a bottom surface of the panel bottom member, and
wherein the first flexible circuit board is bent below the panel bottom member, the first flexible circuit board comprising:
a first end of the first flexible circuit board attached to a first pad unit of the first force sensor; and
a second end of the first flexible circuit board disposed below the panel bottom member.

4. The display device of claim 3, wherein the first pad unit of the first force sensor is disposed at one end of the first force sensor in a longitudinal direction of the first force sensor.

5. The display device of claim 3, wherein the first flexible circuit board extends from the first pad unit of the first force sensor in a third direction, and
wherein the first flexible circuit board is bent in a fourth direction crossing the third direction.

6. A display device comprising:
a display panel to display an image in a first direction, the display panel comprising a flat portion and a curved portion;
a first force sensor disposed below the curved portion of the display panel in a second direction opposite to the first direction;
a display circuit board attached to a first side of the display panel;
a first flexible circuit board connecting the first force sensor and the display circuit board, the first flexible circuit board overlapping the curved portion of the display panel in the first direction; and
a panel bottom member disposed below the display panel, wherein:
the display circuit board is bent a least once, and
the first flexible circuit board is bent at least once, wherein the display circuit board is bent over a bottom side of the panel bottom member, the display circuit board comprising:
a first side of the display circuit board attached to one surface of the display panel; and
a second side of the display circuit board disposed below the panel bottom member.

7. The display device of claim 3, further comprising:
a second force sensor disposed below the display panel; and
a second flexible circuit board connecting the second force sensor and the display circuit board,
wherein the second flexible circuit board is bent at least once.

8. The display device of claim 7, further comprising:
a panel bottom member disposed below the display panel.

9. The display device of claim 8, wherein the second force sensor is attached to a bottom surface of the panel bottom member, and
wherein the second flexible circuit board is bent below the panel bottom member, the second flexible circuit board comprising:
a first end of the second flexible circuit board attached to a second pad unit of the second force sensor; and
a second end of the second flexible circuit board disposed below the panel bottom member.

10. The display device of claim 9, wherein the second pad unit of the second force sensor is disposed at one end of the second force sensor in a longitudinal direction of the second force sensor.

11. The display device of claim 9, wherein the second flexible circuit board extends from the second pad unit of the second force sensor in a third direction, and
wherein the second flexible circuit board is bent in a fourth direction crossing the third direction.

12. The display device of claim 7, wherein the display circuit board comprises:
a first connector connected to a first connector connecting portion of the first flexible circuit board, the first connector connecting portion disposed at the second end of the first flexible circuit board; and
a second connector connected to a second connector connecting portion of the second flexible circuit board, the second connector connecting portion disposed at the second end of the second flexible circuit board.

13. The display device of claim 12, wherein the first connector is disposed adjacent to the first side of the display circuit board, and
wherein the second connector is disposed adjacent to a second side of the display circuit board that is opposite to the first side of the display circuit board.

14. The display device of claim 7, wherein the display circuit board comprises:
a first connector receiving portion connected to a first connector connecting portion of the first flexible circuit board, the first connector connecting portion disposed at the first end of the first flexible circuit board; and
a second connector receiving portion connected to a second connector connecting portion of the second flexible circuit board, the second connector connecting portion disposed at the first end of the second flexible circuit board.

15. The display device of claim 1, wherein in a plan view, the first side of the display panel is partially recessed, the display panel comprising a first protruding portion and a second protruding portion in which pixels are formed to display an image.

16. The display device of claim 15, wherein the display circuit board is disposed on the first and second protruding portions.

17. The display device of claim 7, wherein:
the flat portion of the display panel having a first side and a second side opposite to the first side,
the curved portion of the display panel comprises a first curved portion extending from the first side of the flat portion of the display panel and a second curved portion extending from the second side of the flat portion of the display panel, and
the first and second force sensors are disposed to overlap first curved portion and the second curved portion of the display panel, respectively.

18. The display device of claim 1, wherein the first force sensor comprises force sensor cells, each of the force sensor cells comprising:
driving electrodes and sensing electrodes disposed on a surface of a first substrate; and
a force sensing layer disposed on a surface of a second substrate facing the first substrate.

19. The display device of claim 7, further comprising:
a waterproof member disposed adjacent to the first and second force sensors.

20. A method of manufacturing a display device, comprising:
providing a display panel to display an image through a top surface thereof, the display panel comprising a flat portion and a curved portion;
attaching a first force sensor to one edge of a bottom surface of a heat dissipation sheet, the first force sensor overlapping the curved portion of the display panel in a first direction;
attaching the heat dissipation sheet to a bottom surface of the display panel through lamination using a roller;
attaching a first flexible circuit board to a pad unit of the first force sensor;
attaching a display circuit board to one side of the display panel;
connecting the first flexible circuit board to a first connector of the display circuit board; and
fixing the display circuit board and the first flexible circuit board by bending the display circuit board and the first flexible circuit board, respectively, over the bottom surface of the display panel such that at least two portions of the first flexible circuit board face each other in the first direction and overlap the curved portion of the display panel in the first direction.

21. The method of claim 20, wherein:
the curved portion of the display panel extends from one side of the flat portion of the display panel, and
the first force sensor is disposed to overlap the curved portion of the display panel in the first direction.

22. The method of claim 21, wherein the attaching of the heat dissipation sheet comprises:
placing the roller on the bottom surface of the heat dissipation sheet in the flat portion of the display panel and pressurizing the heat dissipation sheet with the roller.

23. The display device of claim 1, wherein the at least two portions of the first flexible circuit board comprises:
a first portion connected to the first force sensor and extending along the curved potion of the display panel; and
a second portion connected to the display circuit board and extending along the first side of the display panel.

* * * * *